US012765163B2

(12) United States Patent
So et al.

(10) Patent No.: US 12,765,163 B2
(45) Date of Patent: Oct. 13, 2026

(54) LIGHT EMITTING ELEMENT HAVING A PARTITIONED SEMICONDUCTOR LAYER WITH DIFFERENT SIDEWALL SLOPES, METHOD OF MANUFACTURING THE SAME, AND DISPLAY DEVICE COMPRISING THE LIGHT EMITTING ELEMENT

(71) Applicant: Samsung Display Co., LTD., Yongin-si (KR)

(72) Inventors: Myeong Su So, Yongin-si (KR); Seul Ki Kim, Yongin-si (KR); Si Sung Kim, Yongin-si (KR); Chi Hun Won, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 416 days.

(21) Appl. No.: 18/449,812

(22) Filed: Aug. 15, 2023

(65) Prior Publication Data

US 2024/0065017 A1 Feb. 22, 2024

(30) Foreign Application Priority Data

Aug. 19, 2022 (KR) ........................ 10-2022-0104333

(51) Int. Cl.
*H10K 50/13* (2023.01)
*H10K 50/115* (2023.01)
(Continued)

(52) U.S. Cl.
CPC ............. *H10K 50/13* (2023.02); *H10K 50/12* (2023.02); *H10K 59/1201* (2023.02);
(Continued)

(58) Field of Classification Search
None
See application file for complete search history.

(56) References Cited

U.S. PATENT DOCUMENTS

| | | | | |
|---|---|---|---|---|
| 11,973,066 B2 | 4/2024 | Cha et al. | | |
| 2015/0295131 A1* | 10/2015 | Saito | .................... | H10H 20/825 438/46 |

(Continued)

FOREIGN PATENT DOCUMENTS

| | | |
|---|---|---|
| KR | 10-2020-0023319 | 3/2020 |
| KR | 10-2089499 | 3/2020 |

(Continued)

*Primary Examiner* — Nduka E Ojeh
(74) *Attorney, Agent, or Firm* — CANTOR COLBURN LLP

(57) ABSTRACT

A light emitting element includes a first semiconductor layer; an active layer; a second semiconductor layer; a first electrode; and a second electrode. The active layer includes a first surface contacting the first semiconductor layer, a second surface facing the first surface and contacting the second semiconductor layer, and a side connected to the first surface and the second surface. The first semiconductor layer includes partitioned first, second, and third areas. A side of the first area is inclined in a same direction as the side of the active layer, a side of the second area is inclined in a direction opposite to the direction in which the side of the active layer is inclined, and a side of the third area includes a straight line part parallel to the length direction of the light emitting element.

20 Claims, 23 Drawing Sheets

(51) Int. Cl.

| | |
|---|---|
| ***H10K 50/12*** | (2023.01) |
| ***H10K 59/12*** | (2023.01) |
| ***H10K 59/122*** | (2023.01) |
| ***H10K 59/123*** | (2023.01) |
| ***H10K 59/131*** | (2023.01) |
| ***H10K 59/38*** | (2023.01) |
| ***H10K 59/80*** | (2023.01) |

(52) U.S. Cl.
CPC ......... *H10K 59/122* (2023.02); *H10K 59/123* (2023.02); *H10K 59/131* (2023.02); *H10K 59/38* (2023.02); *H10K 50/115* (2023.02); *H10K 59/8731* (2023.02)

(56) References Cited

U.S. PATENT DOCUMENTS

| | | | | |
|---|---|---|---|---|
| 2017/0064884 | A1* | 3/2017 | Kim | H05K 13/041 |
| 2021/0320226 | A1* | 10/2021 | Sugawara | H10H 20/8316 |
| 2022/0158039 | A1 | 5/2022 | Sim et al. | |
| 2023/0073501 | A1* | 3/2023 | Kim | H10H 20/821 |
| 2023/0261136 | A1* | 8/2023 | Lee | H10H 20/819 257/79 |
| 2024/0055558 | A1* | 2/2024 | Park | H10H 20/819 |
| 2025/0185421 | A1* | 6/2025 | Kim | H10H 20/821 |

FOREIGN PATENT DOCUMENTS

| | | |
|---|---|---|
| KR | 10-2021-0044789 | 4/2021 |
| KR | 1020220030424 A | 3/2022 |
| KR | 10-2022-0069185 | 5/2022 |

* cited by examiner

170: 170a, 170b

LIGHT EMITTING ELEMENT HAVING A PARTITIONED SEMICONDUCTOR LAYER WITH DIFFERENT SIDEWALL SLOPES, METHOD OF MANUFACTURING THE SAME, AND DISPLAY DEVICE COMPRISING THE LIGHT EMITTING ELEMENT

CROSS-REFERENCE TO RELATED APPLICATION(S)

This application claims priority to and benefits of Korean patent application No. 10-2022-0104333 under 35 U.S.C. § 119 filed on Aug. 19, 2022, in the Korean Intellectual Property Office, the entire contents of which are incorporated herein by reference.

BACKGROUND

1. Technical Field

The disclosure generally relates to a light emitting element, a method of manufacturing the same, and a display device comprising the light emitting element.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a light emitting element having an improved element characteristic and a method of manufacturing the light emitting element.

Embodiments also provide a display device comprising the above-described light emitting element.

In accordance with an aspect of the disclosure, there is provided a light emitting element that may include a first end portion and a second end portion, facing each other in a length direction, the light emitting element may include a first semiconductor layer disposed at the second end portion; an active layer disposed on the first semiconductor layer; a second semiconductor layer disposed on the active layer; a first electrode disposed on the second semiconductor layer; and a second electrode disposed on the first electrode, wherein the active layer may include a first surface contacting the first semiconductor layer; a second surface facing the first surface and contacting the second semiconductor layer; and a side connected to the first surface and the second surface, wherein the first semiconductor layer may include a first area, a second area, and a third area partitioned in a direction toward the second end portion from the first surface of the active layer, and a side of the first area is inclined in a same direction as the side of the active layer, a side of the second area is inclined in a direction opposite to the direction in which the side of the active layer is inclined, and a side of the third area includes a straight line part parallel to the length direction.

The first semiconductor layer may include an n-type semiconductor layer doped with an n-type dopant, and the second semiconductor layer may include a p-type semiconductor layer doped with a p-type dopant.

A slope of the side of the first area may be equal to a slope of the side of the active layer, and a slope of the side of the second area may be different from the slope of the side of the active layer.

The light emitting element may further include an insulating film surrounding an outer circumferential surface of each of the first semiconductor layer, the active layer, the second semiconductor layer, and the first electrode.

In accordance with another aspect of the disclosure, there is provided a method of manufacturing a light emitting element, the method may include forming a light emitting stack structure including a first semiconductor layer, an active layer, a second semiconductor layer, and a first electrode on a substrate; exposing an area of the first semiconductor layer by forming a first mask pattern on the first electrode and etching the light emitting stack structure in a vertical direction through a first etching process using the first mask pattern; forming a second mask pattern on the light emitting stack structure; exposing the substrate by etching an area of the first semiconductor layer through a second etching process using the second mask pattern; forming a light emitting stack pattern by etching a side of the first semiconductor layer not covered by the second mask pattern, through a third etching process; exposing the first electrode by removing the first mask pattern and the second mask pattern; and forming an insulating film surrounding a surface of the light emitting stack pattern by forming an insulating material layer on the light emitting stack pattern and etching the insulating material layer in the vertical direction.

The first semiconductor layer may be partitioned into a first area adjacent to the active layer, a third area adjacent to the substrate, and a second area disposed between the first area and the third area in the forming of the light emitting stack pattern.

A side of the first area may be inclined in a same direction as a side of the active layer, a side of the second area may be inclined in a direction opposite to a direction in which the side of the active layer is inclined, and a side of the third area may include a straight line part parallel to the vertical direction.

Each of the first etching process and the second etching process may be a dry etching process, and the third etching process may be a wet etching process.

The first semiconductor layer may include an n-type semiconductor layer doped with an n-type dopant, and the second semiconductor layer may include a p-type semiconductor layer doped with a p-type dopant.

A slope of the side of the first area may be equal to a slope of the side of the active layer, and a slope of the side of the second area may be different from the slope of the side of the active layer.

The second mask pattern may cover the side of the first area of the first semiconductor layer and completely cover the first mask pattern, the first electrode, the second semiconductor layer, and the active layer in the forming of the second mask pattern.

The first mask pattern and the second mask pattern may include silicon oxide.

The method may further include after the forming of the insulating film, forming a second electrode on the first electrode; and forming a third electrode on the second electrode.

The first electrode may include a transparent conductive material, and the second electrode may include a conductive material having reflexibility.

In accordance with the disclosure, there is provided a display device that may include pixels disposed on a substrate, wherein each of the pixels may include at least one transistor disposed on the substrate; a pixel electrode electrically connected to the at least one transistor; a bank disposed on the pixel electrode, the bank including an opening exposing the pixel electrode; a light emitting element disposed in the opening of the bank to be bonded to the pixel electrode, the light emitting element including a first end portion and a second end portion, facing each other in a length direction; and a common electrode disposed on the light emitting element, wherein the light emitting element may include a third electrode; a second electrode; a first electrode; a second semiconductor layer; an active layer; and a first semiconductor layer, disposed in a direction toward the common electrode from the pixel electrode.

The first semiconductor layer may include a first area, a second area, and a third area partitioned in the direction toward the common electrode from the pixel electrode. A side of the first area may be inclined in a same direction as the side of the active layer, a side of the second area may be inclined in a direction opposite to the direction in which the side of the active layer is inclined, and a side of the third area may include a straight line part parallel to the length direction.

The active layer may have a substantially reverse tapered shape between the pixel electrode and the common electrode.

The light emitting element may include the third electrode disposed at the first end portion, the third electrode electrically connected to the pixel electrode and electrically contacting the pixel electrode; the first semiconductor layer disposed at the second end portion, the first semiconductor layer electrically connected to the common electrode and electrically contacting the common electrode; the second electrode disposed on the third electrode between the third electrode and the first semiconductor layer; the first electrode disposed on the second electrode between the second electrode and the first semiconductor layer; the second semiconductor layer disposed on the first electrode between the first electrode and the first semiconductor layer; and the active layer disposed between the second semiconductor layer and the first semiconductor layer.

The first semiconductor layer may be an n-type semiconductor layer doped with an n-type dopant, and the second semiconductor layer may be a p-type semiconductor layer doped with a p-type dopant.

The first electrode may include a transparent conductive material, and the second electrode may include a conductive material having reflexibility. The third electrode may be a bonding electrode that bonds the pixel electrode and the light emitting element.

The pixel electrode may include a conductive material having reflexibility, and the common electrode may include a transparent conductive material.

Each of the pixels may further include an intermediate layer disposed between the bank and the common electrode to fill the opening of the bank. The intermediate layer may fix the light emitting element, and include a material which has an adhesive property and is cured.

Each of the pixels may further include an emission area including the light emitting element and a non-emission area adjacent to the emission area; a cover layer disposed entirely on the common electrode; and an upper substrate disposed on the cover layer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
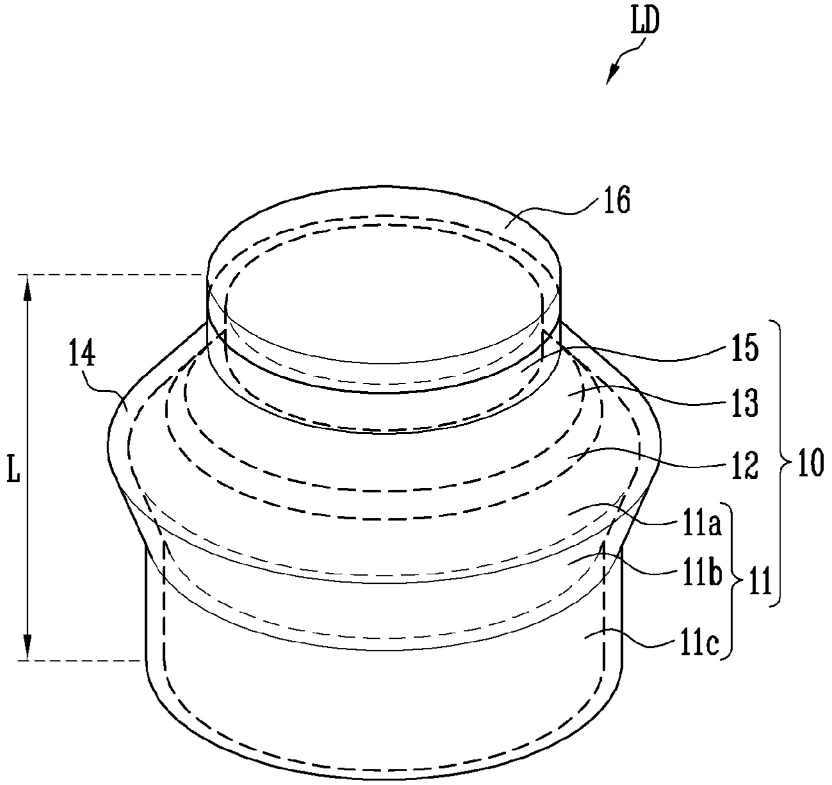
FIG. 1 is a schematic perspective view schematically illustrating a light emitting element in accordance with an embodiment.

The disclosure may apply various changes and different shapes or forms, but is not limited thereto. However, the examples are not limited to certain shapes but apply to all changes, variations and equivalent material and replacements. The drawings included may be expanded for ease of understanding.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, the thickness of certain lines, layers, components, elements or features may be exaggerated for clarity. For example, in the drawing figures and dimensions may be exaggerated for clarity of illustration. It will be understood that when an element is referred to as being "between" two elements, it may be the only element between the two elements, or one or more intervening elements may also be present. Like reference numerals refer to like elements throughout.

As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean “A, B, or A and B.”

It will be understood that, although the terms “first,” “second,” etc. may be used herein to describe various elements, these elements should not be limited by these terms. These terms are only used to distinguish one element from another element. Thus, a “first” element discussed below could also be termed a “second” element without departing from the teachings of the disclosure.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as ‘not overlapping’ or ‘to not overlap’ another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

As used herein, the singular forms are intended to include the plural forms as well, unless the context clearly indicates otherwise.

It will be further understood that the terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, an expression that an element such as a layer, region, substrate or plate is placed “on” or “above” another element indicates not only a case where the element is placed “directly on” or “just above” the other element but also a case where a further element or elements may be interposed between the element and the other element. On the contrary, an expression that an element such as a layer, region, substrate or plate is placed “beneath” or “below” another element indicates not only a case where the element is placed “directly beneath” or “just below” the other element but also a case where a further element or elements may be interposed between the element and the other element.

In this specification, it will be understood that, when an element (for example, a first element) is “(operatively or communicatively) coupled with/to” or “connected to” another element (for example, a second element), the element may be directly coupled with/to another element, and there may be an intervening element (for example, a third element) between the element and another element. Also, in this specification, the term “connection” or “coupling” may inclusively mean connection or physical and/or electrical coupling.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments and information required for those skilled in the art to readily understand the content of the disclosure will be described in detail with reference to the accompanying drawings. In the following description, singular forms in the disclosure are intended to include the plural forms as well, unless the context clearly indicates otherwise.

Figure 2:
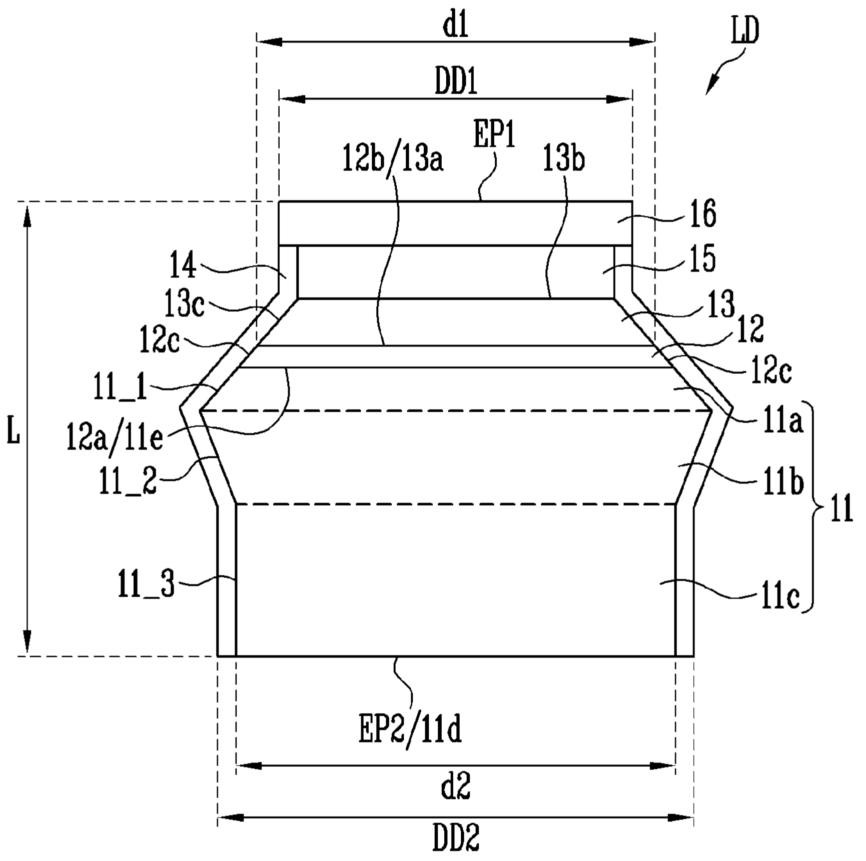
FIG. 2 is a schematic cross-sectional view of the light emitting element shown in FIG. 1.

FIG. 1 is a schematic perspective view schematically illustrating a light emitting element LD in accordance with an embodiment. FIG. 2 is a schematic cross-sectional view of the light emitting element LD shown in FIG. 1.

Referring to FIGS. 1 and 2, the light emitting element LD may include a first semiconductor layer 11, a second semiconductor layer 13, and an active layer 12 interposed between the first semiconductor layer 11 and the second semiconductor layer 13. Also, the light emitting element LD may include a first electrode 15 disposed on the second semiconductor layer 13. In an embodiment, the light emitting element LD may be implemented with a vertical light emitting stack pattern 10 in which the first semiconductor layer 11, the active layer 12, the second semiconductor layer 13, and the first electrode 15 may be sequentially stacked each other.

The light emitting element LD may be provided in a shape extending in one direction or a direction. In case that assuming that an extending direction of the light emitting element LD is a length direction, the light emitting element LD may include a first end portion EP1 and a second end portion EP2, which face each other along the length direction. One semiconductor layer selected from the first semiconductor layer 11 and the second semiconductor layer 13 may be disposed at the first end portion EP1 of the light emitting element LD, and the other semiconductor layer selected from the first semiconductor layer 11 and the second semiconductor layer 13 may be disposed at the second end portion EP2 of the light emitting element LD. In an example, the second semiconductor layer 13 may be disposed at the first end portion EP1 of the light emitting element LD, and the first semiconductor layer 11 may be disposed at the second end portion EP2 of the corresponding light emitting element LD.

The light emitting element LD may be provided in various shapes. In an example, the light emitting element LD may have a rod-like shape, a bar-like shape, or a pillar-like shape. In an embodiment, the light emitting element LD may have a pillar-like shape in which a diameter DD1 of the first end portion EP1 and a diameter DD2 of the second end portion EP2 are different from each other. In an example, the light emitting element LD may have a pillar-like shape in which the diameter DD1 of the first end portion EP1 is smaller than the diameter DD2 of the second end portion EP2.

A length L of the light emitting element LD in the extending direction (or the length direction) may be greater or smaller than the diameter DD1 of the first end portion EP1 (or a width of a first cross-section) or the diameter DD2 of the second end portion EP2 (or a width of a second cross-section). However, the disclosure is not limited thereto. In an embodiment, the length L of the light emitting element LD may be equal to the diameter DD1 of the first end portion EP1 or be equal to the diameter DD2 of the second end portion EP2. The above-described light emitting element LD may include a light emitting diode (LED) manufactured to have diameters DD1 and DD2 and/or a length L to a degree of nano scale (or nanometer) to micrometer scale (or micrometer). In an embodiment, the light emitting element LD may include a vertical LED emitting blue-based light.

The first semiconductor layer 11 may include, for example, at least one n-type semiconductor layer. For example, the first semiconductor layer 11 may include any one semiconductor material among InAlGaN, GaN, AlGaN, InGaN, AN, and InN, and include an n-type semiconductor layer doped with a first conductivity type dopant (or n-type dopant) such as Si, Ge or Sn. However, the material constituting the first semiconductor layer 11 is not limited thereto. The first semiconductor layer 11 may include various materials. The first semiconductor layer 11 may include a first surface 11*d* and a second surface 11*e*, which face each other in the length direction of the light emitting element LD. The second surface 11*e* may be in contact with the active layer 12, and the first surface 11*d* may be in contact with an electrode, for example, a common electrode (see "CE" shown in FIG. 25).

The active layer 12 is disposed on the first semiconductor layer 11, and may be a region in which electrons and holes are recombined. As the electrons and the holes are recombined in the active layer 12, light (or beam) may be generated, which has an energy level changed to a low energy level and has a wavelength corresponding to the low energy level. The active layer 12 may be formed, including a semiconductor material having, for example, a composition formula of $In_xAl_yGa_{1-x-y}N$ ($0 \le x \le 1$, $0 \le y \le 1$, $0 \le x+y \le 1$). The active layer 12 may be formed in a multi-quantum well structure, but the disclosure is not limited thereto. In the active layer 12 formed in the multi-quantum well structure, a barrier layer, a strain reinforcing layer, and a well layer may be periodically and repeatedly stacked each other as one unit. However, the structure of the active layer 12 is not limited to the above-described embodiment.

The active layer 12 may include a first surface 12*a* and a second surface 12*b*, which face each other in the length direction of the light emitting element LD. The first surface 12*a* may be in contact with the first semiconductor layer 11, and the second surface 12*b* may be in contact with the second semiconductor layer 13. The active layer 12 may include a side 12*c* connected to the first surface 12*a* and the second surface 12*b*.

The second semiconductor layer 13 is disposed on the active layer 12, and provides holes to the active layer 12. The second semiconductor layer 13 may include a semiconductor layer having a type different from the type of the first semiconductor layer 11. In an example, the second semiconductor layer 13 may include at least one p-type semiconductor layer. For example, the second semiconductor layer 13 may include at least one semiconductor material among InAlGaN, GaN, AlGaN, InGaN, AN, and InN, and include a p-type semiconductor layer doped with a second conductivity type dopant (or p-type dopant) such as Mg, Zn, Ca, Sr or Ba. However, the material constituting the second semiconductor layer 13 is not limited thereto. The second semiconductor layer 13 may include various materials. In an embodiment, the second semiconductor layer 13 may include a gallium nitride (GaN) semiconductor material doped with a second conductivity type dopant (or p-type dopant). The second semiconductor layer 13 may include a first surface 13*a* and a second surface 13*b*, which face each other in the length direction of the light emitting element LD. The first surface 13*a* may be in contact with the active layer 12, and the second surface 13*b* may be in contact with the first electrode 15. The second semiconductor layer 13 may include a side 13*c* connected to the first surface 13*a* and the second surface 13*b*.

A diameter d1 of the second semiconductor layer 13 in a direction perpendicular to the length direction of the light emitting element LD may be smaller than a diameter d2 of the first semiconductor layer 11, but the disclosure is not limited thereto. The diameter d1 of the second semiconductor layer 13 may be a diameter of the first surface 13*a* of the corresponding semiconductor layer, and the diameter d2 of the first semiconductor layer 11 may be a diameter of the first surface 11*d* of the corresponding semiconductor layer.

In an embodiment, the first semiconductor layer 11 and the second semiconductor layer 13 may have different thicknesses in the length direction of the light emitting element LD. In an example, the first semiconductor layer 11 may have a thickness relatively thicker than a thickness of the second semiconductor layer 13 along the length direction of the light emitting element LD.

In FIGS. 1 and 2, although it is illustrated that each of the first semiconductor layer 11 and the second semiconductor layer 13 is a layer, the disclosure is not limited thereto. In an embodiment, each of the first semiconductor layer 11 and the second semiconductor layer 13 may further include at least one layer, for example, a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR layer may be a p-type semiconductor layer such as p-GaInP, p-AlInP or p-AlGaInP, but the disclosure is not limited thereto.

The first electrode 15 may be disposed on the second semiconductor layer 13. The first electrode 15 may be an ohmic contact electrode electrically connected to the second semiconductor layer 13. The first electrode 15 may include a metal made of a conductive material having a certain transmittance (or light transmittance) or more. In an example, the first electrode 15 may use one or mixture of chromium (Cr), titanium (Ti), aluminum (Al), gold (Au), nickel (Ni), and any oxide or alloy thereof, indium tin oxide (ITO), indium zinc oxide (IZO), and indium tin zinc oxide (ITZO). The first electrode 15 may be substantially transparent. In an embodiment, the first electrode 15 may include a transparent conductive material.

The first semiconductor layer 11, the active layer 12, the second semiconductor layer 13, and the first electrode 15, which may be sequentially stacked each other, may constitute the light emitting stack pattern 10.

The light emitting element LD may include a second electrode 16 disposed on the light emitting stack pattern 10. The second electrode 16 may be formed on the first electrode 15. The second electrode 16 may be a reflective member which guides light emitted from the active layer 12 to a desired area. To this end, the second electrode 16 may include a conductive material having reflexibility. The conductive material may include an opaque metal advantageous in reflecting light emitted from the active layer 12 in a desired direction. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the disclosure is not limited thereto.

The light emitting element LD may further include an insulating film 14. However, in an embodiment, the insulating film 14 may be omitted, and be provided to cover only a portion of the light emitting stack pattern 10.

The insulating film 14 may prevent an electrical short circuit which may occur in case that the active layer 12 is in contact with a conductive material in addition to the first semiconductor layer 11 and the second semiconductor layer 13. Also, the insulating film 14 minimizes a surface defect of the light emitting element LD, thereby improving the lifespan and light emission efficiency of the light emitting element LD. Also, in case that light emitting elements LD are densely disposed, the insulating film 14 may prevent an unwanted short circuit which may occur between the light emitting elements LD. Whether the insulating film 14 is provided is not limited as long as the active layer 12 may prevent occurrence of a short circuit with an external conductive material.

The insulating film 14 may be provided in a shape entirely surrounding an outer circumferential surface of the light emitting stack pattern 10 including the first semiconductor layer 11, the active layer 12, the second semiconductor layer 13, and the first electrode 15.

The insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like within the spirit and the scope of the disclosure. However, the disclosure is not limited thereto, and various materials having insulating properties may be used as the material of the insulating film 14.

The insulating film 14 may be provided in the form of a single layer or be provided in the form of a multi-layer including two layers. In an example, in case that the insulating film 14 may be a double layer including a first layer and a second layer, which may be sequentially stacked each other, the first layer and the second layer may be made of different materials (or substances), and be formed through different processes. In an embodiment, the first layer and the second layer may be formed of a same material or a similar material through a continuous process.

The above-described light emitting element LD may be grown and manufactured on a substrate for epitaxial growth.

In an embodiment, the first semiconductor layer 11 may include a first area 11*a*, a second area 11*b*, and a third area 11*c*, which are partitioned along a direction toward the second end portion EP2 of the light emitting element LD from the first surface 12*a* of the active layer 12. The first area 11*a* may be one area of the first semiconductor layer 11, which is immediately adjacent to the active layer 12, and the third area 11*c* may be another area of the first semiconductor layer 11, which is immediately adjacent to the second end portion EP2 of the light emitting element LD. The second area 11*b* may be the other area of the first semiconductor layer 11 except the first area 11*a* and the third area 11*c*.

In an embodiment, a side 11_1 of the first area 11*a*, a side 11_2 of the second area 11*b*, and a side 11_3 of the third area 11*c* may not be located (or disposed) on a same line. In an example, the side 11_1 of the first area 11*a* may be inclined in a same direction as the side 12*c* of the active layer 12, the side 11_2 of the second area 11*b* may be inclined in a direction different from, for example, the opposite direction of the direction in which the side 12*c* of the active layer 12 is inclined, and the third area 11*c* may not be inclined, including a straight line part parallel to the length direction of the light emitting element LD. A slope of the side 11_1 of the first area 11*a* may be equal to a slope of the side 12*c* of the active layer 12, and a slope of the side 11_2 of the second area 11*b* may be different from the slope of the side 12*c* of the active layer 12.

The above-described first semiconductor layer 11 may be partitioned into the first area 11*a*, the second area 11*b*, and the third area 11*c*, of which sides are not located on a same line (or are located on different lines) by an etching process repeatedly performed during a manufacturing process of the light emitting element LD. This will be described in detail later with reference to FIGS. 3 to 18.

The side 13*c* of the second semiconductor layer 13 may be inclined in a same direction as the side 12*c* of the active layer 12. In an example, a slope of the side 13*c* of the second semiconductor layer 13 may be equal to the slope of the side 12*c* of the active layer 12.

The above-described light emitting element LD may be used as a light emitting source (or light source) for various display devices. The light emitting element LD may be manufactured through a surface treatment process. For example, in case that light emitting elements LD are mixed in a liquid solution (or solvent) to be supplied to each pixel area (for example, an emission area of each pixel or an emission area of each sub-pixel), each light emitting element LD may be surface-treated such that the light emitting elements LD are not unequally condensed in the solution but equally dispersed in the solution.

FIGS. 3 to 18 are schematic cross-sectional views sequentially illustrating a method of manufacturing the light emitting element in accordance with an embodiment.

Figure 3:
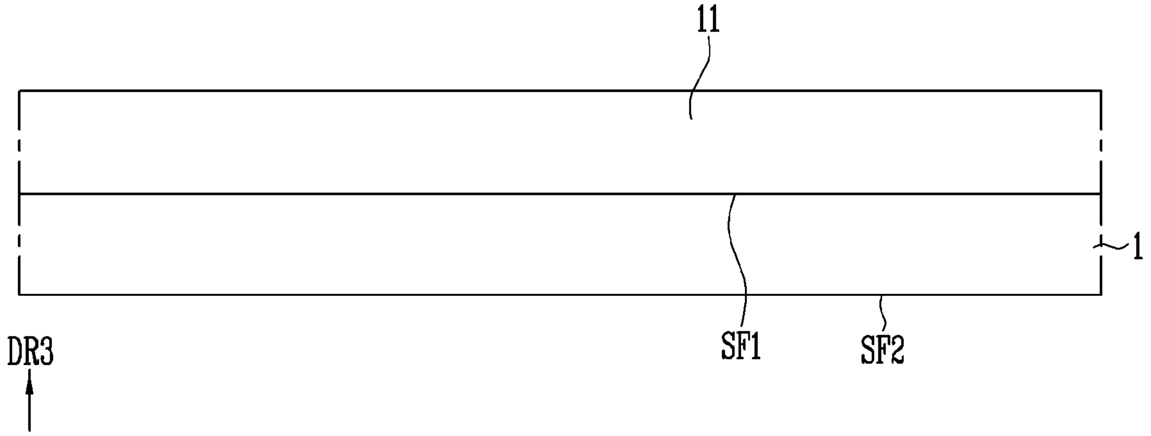
FIGS. 3 to 18 are schematic cross-sectional views sequentially illustrating a method of manufacturing the light emitting element in accordance with an embodiment.
Figure 4:
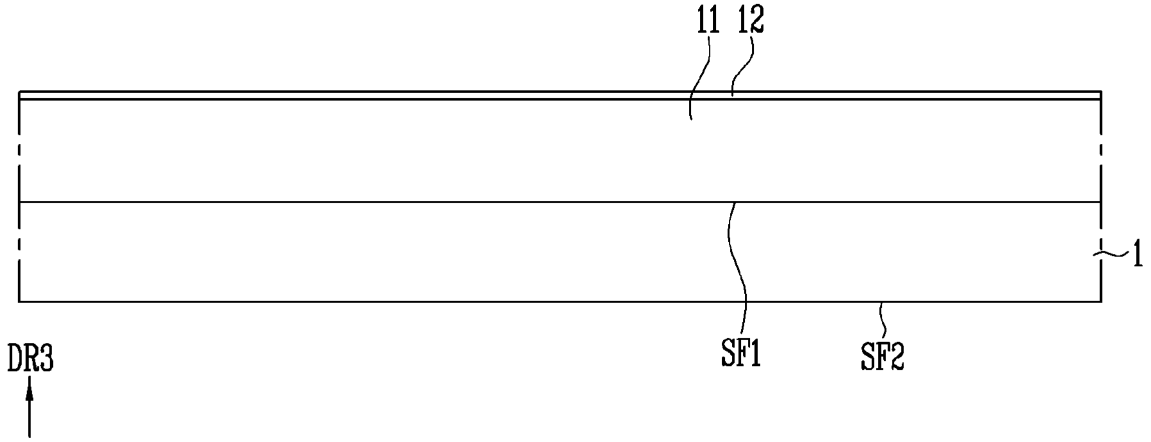
Figure 5:
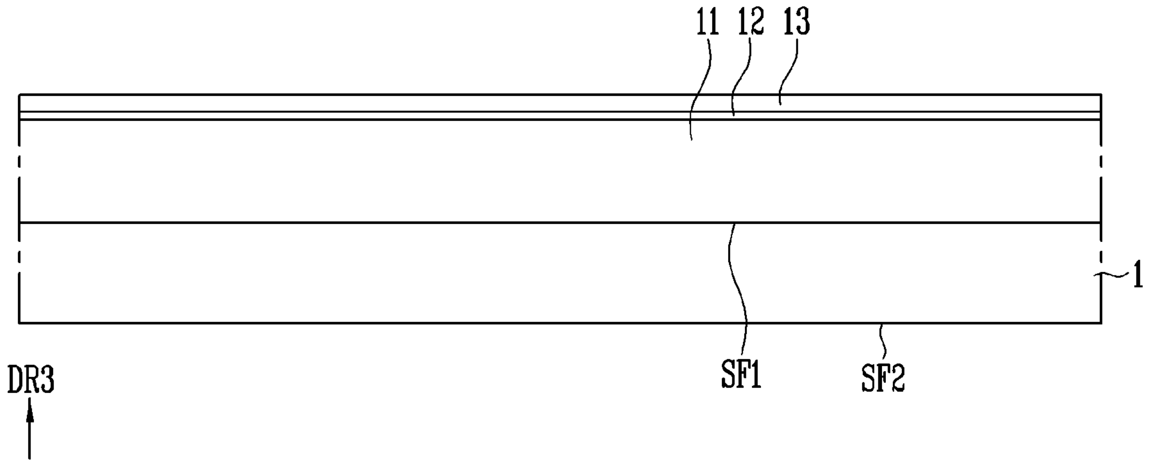
Figure 6:
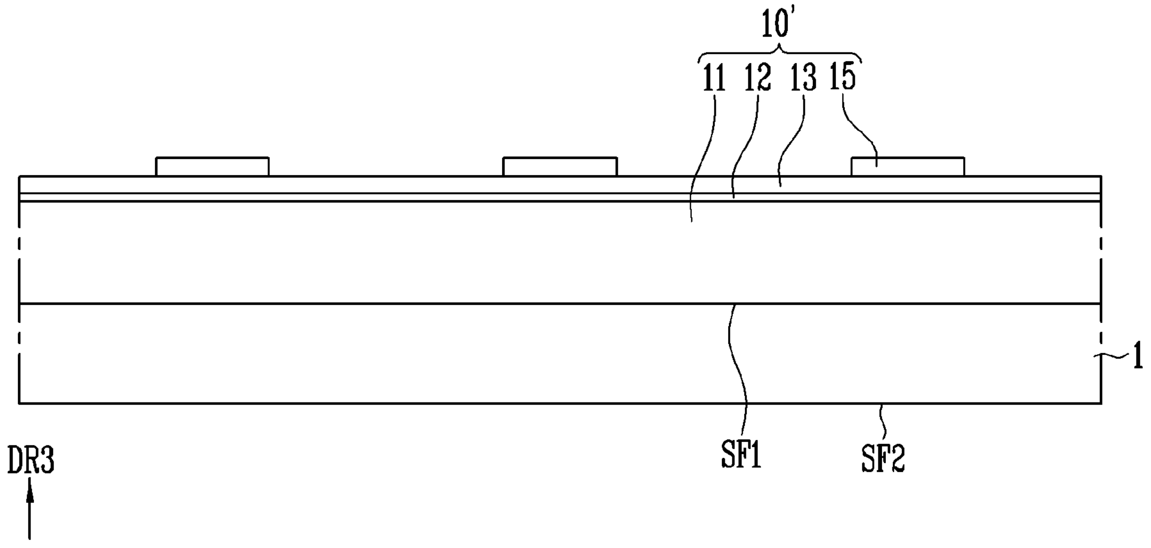
Figure 7:
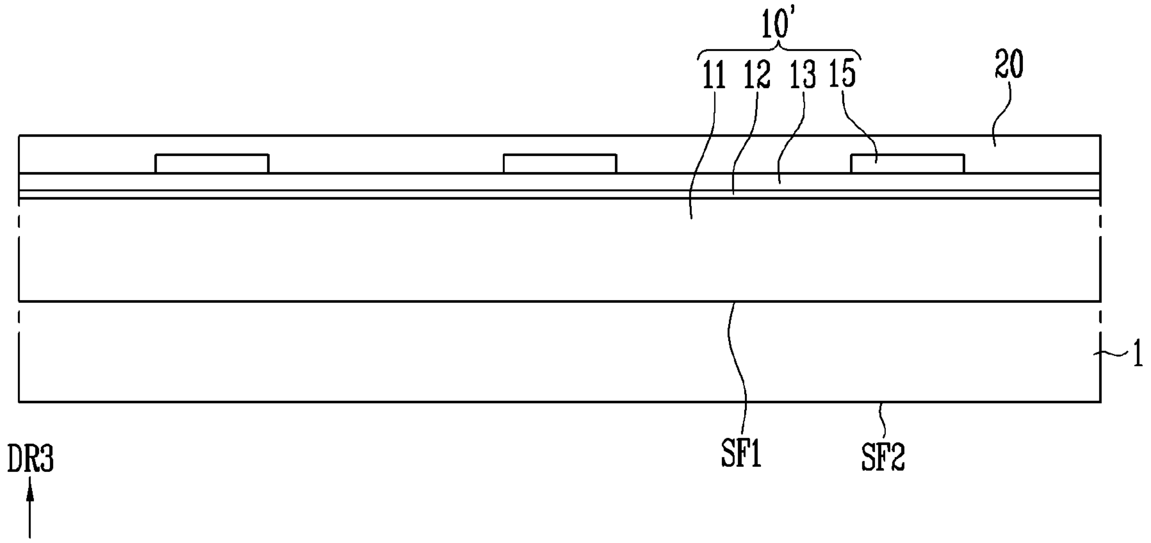
Figure 8:
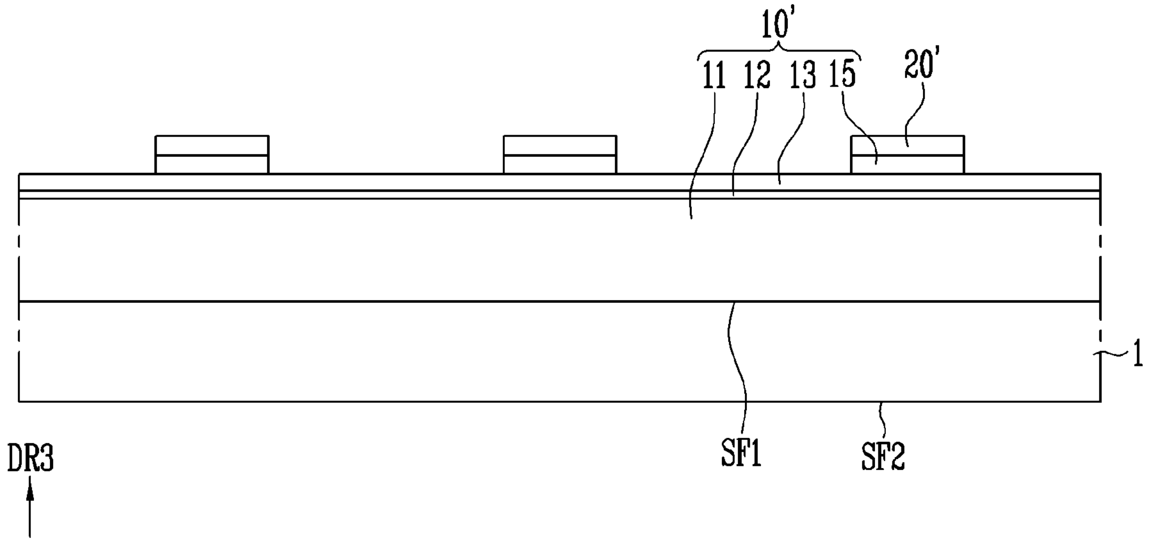

Referring to FIGS. 1 to 3, a support substrate 1 to support a light emitting element LD is prepared.

The support substrate 1 may be a GaAs, GaP or InP substrate. The support substrate 1 may be a wafer (or growth substrate) for epitaxial growth. The support substrate 1 may include a ZnO substrate having a GaAs layer on a surface thereof. A Ge substrate having a GaAs layer on the surface and a Si substrate having a GaAs layer on a Si wafer with a buffer layer interposed therebetween may be applied as the support substrate 1.

A material of the support substrate 1 is not limited to the above-described example, so long as the material satisfies a selectivity for manufacturing the light-emitting element LD and achieves epitaxial growth smoothly.

The support substrate 1 may include a first surface SF1 and a second surface SF2, which face each other in a thickness direction thereof, for example, a third direction DR3. In an embodiment, a sacrificial layer may be formed on the first surface SF1. The sacrificial layer may be a layer removed in a final manufacturing process of the light emitting element LD.

A first semiconductor layer 11 is formed on the first surface SF1 of the support substrate 1. The first semiconductor layer 11 may be formed through epitaxial growth, and be formed by using a Metal-Organic Chemical Vapor Deposition (MOCVD) method, a Molecular Beam Epitaxy (MBE) method, a Vapor Phase Epitaxy method, Liquid Phase Epitaxy (LPE) method, or the like within the spirit and the scope of the disclosure.

The first semiconductor layer 11 may include a semiconductor material composed of Group III (Ga, Al, In) to Group V (P, As) materials, and include a semiconductor layer doped with a first conductivity type dopant (or n-type dopant) such as Si, Ge, or Sn. For example, the first semiconductor layer 11 may include at least one semiconductor material among GaP, GaAs, GaInP, and AlGaInP, doped with Si. The first semiconductor layer 11 may include at least one n-type semiconductor layer.

In an embodiment, an additional semiconductor layer for crystallinity improvement, including a buffer layer, an undoped semiconductor layer, and the like, may be further formed between the first semiconductor layer 11 and the support substrate 1. In an example, the additional semiconductor layer may include a gallium nitride (GaN) semiconductor material doped with a low concentration impurity. The gallium nitride (GaN) semiconductor material may be integrally formed with the first semiconductor layer 11. The gallium nitride (GaN) semiconductor material may be an n-type semiconductor layer.

Referring to FIGS. 1 to 4, an active layer 12 is formed on the first semiconductor layer 11. The active layer 12 is a region in which electrons and holes are recombined. As the electrons and the holes are recombined, the active layer 12 may emit light which has an energy level changed to a low energy level and has a wavelength corresponding to the low energy level. The active layer 12 may be formed on the first semiconductor layer 11, and be formed in a multi-quantum well structure. The position of the active layer 12 may be variously changed according to the size of the light emitting element LD, and the like within the spirit and the scope of the disclosure.

Referring to FIGS. 1 to 5, a second semiconductor layer 13 is formed on the active layer 12. The second semiconductor layer 13 may include a semiconductor layer having a type different from the type of the first semiconductor layer 11. The second semiconductor layer 13 may include a semiconductor material composed of Group III (Ga, Al, In) to Group V (P, As) materials, and include a semiconductor layer doped with a second conductivity type dopant (or p-type dopant) such as Mg, Zn, Ca, Sr or Ba. For example, the second semiconductor layer 13 may include at least one semiconductor material among GaP, GaAs, GaInP, and AlGaInP, doped with Mg. For example, the second semiconductor layer 13 may include a p-type semiconductor layer.

Referring to FIGS. 1 to 6, a first electrode 15 is formed on the second semiconductor layer 13. The first electrode 15 may use one or mixture of chromium (Cr), titanium (Ti), aluminum (Al), gold (Au), nickel (Ni), and any oxide or alloy thereof, indium tin oxide (ITO), indium zinc oxide (IZO), and indium tin zinc oxide (ITZO). In an embodiment, the first electrode 15 minimizes loss of light which is generated from the active layer 12 and emitted to the outside of the light emitting element LD, and may include a transparent conductive oxide such as indium tin oxide (ITO) so as to improve the effect that current spreads into the second semiconductor layer 13.

The first electrode 15 may be an ohmic contact electrode. In an example, the first electrode 15 may form an ohmic contact with the second semiconductor layer 13. However, the disclosure is not limited thereto. In an embodiment, the first electrode 15 may be a Schottky contact electrode.

The first electrode 15 may be deposited on the second semiconductor layer 13 by using a sputtering method. However, the method of forming the first electrode 15 on the second semiconductor layer 13 is not limited to the above-described embodiment, and an ordinary deposition method and the like may be applied. A thickness of the first electrode 15 is determined by considering an oxygen amount, a deposition temperature, and/or a deposition time within a chamber in which a deposition process is performed in case that the corresponding electrode is formed, and may be determined within a range in which loss of light emitted from the active layer 12 is minimized.

The first semiconductor layer 11, the active layer 12, the second semiconductor layer 13, and the first electrode 15, which may be sequentially stacked each other on the support substrate 1, may constitute a light emitting stack structure 10'.

Referring to FIGS. 1 to 7, a first mask 20 is formed on the first electrode 15. The first mask 20 may include an insulating layer. The insulating layer may serve as a mask for continuous etching of the light emitting stack structure 10'. The insulating layer may use oxide or nitride, and include, for example, silicon oxide ($SiO_x$).

Referring to FIGS. 1 to 8, a fine pattern is disposed on the first mask 20, and a first mask pattern 20' is formed by performing a photolithography process using the fine pattern as a mask. The first mask pattern 20' may be formed in a shape corresponding to the fine pattern.

Referring to FIGS. 1 to 9, the light emitting stack structure 10' is etched in a vertical direction, for example, the third direction DR3 at a micro scale (or micrometer) distance by performing a first etching process using the first mask pattern 20' as an etching mask.

A first groove part HM1 exposing one area A of the first semiconductor layer 11 to the outside may be formed by etching one area of the light emitting stack structure 10', which does not correspond to the first mask pattern 20' in the above-described first etching process. The first groove part HM1 may have a shape recessed down to the one area or an area A of the first semiconductor layer 11 along the opposite direction of the third direction DR3 from the first mask pattern 20'.

A dry etching technique such as reactive ion etching (RIE), reactive ion beam etching (RIBE), or inductively coupled plasma reactive ion etching (ICP-RIE) may be used in the above-described first etching process. In the dry etching technique, etching for forming the first groove part HM1, which may be performed in a depth direction, is possible, so that a size of the first groove part HM1, a distance between first groove parts HM1, and the like may be formed as a desired pattern.

In the above-described first etching process, components located on the bottom of the first mask pattern 20' are not etched in a direction parallel to the third direction DR3 but may be etched in a direction inclined with respect to the third direction DR3. A side 13*c* of the second semiconductor layer 13, a side 12*c* of the active layer 12, and a portion 11' of a side of the first semiconductor layer 11, which are exposed in the first groove part HM1, may be inclined in an oblique direction inclined with respect to the third direction DR3.

Referring to FIGS. 1 to 10, a second mask 40 is formed over the light emitting stack structure 10' in which the first groove part HM1 is formed. The second mask 40 may include an insulating layer. The insulating layer may serve as a mask for continuous etching of the light emitting stack structure 10' located on the bottom thereof. The insulating layer may use oxide or nitride. In an example, the insulating layer may include silicon oxide ($SiO_x$).

Referring to FIGS. 1 to 11, another fine pattern is disposed on the second mask 40, and a second mask pattern 40' is formed by performing a photolithography process using the another fine pattern as a mask.

In an embodiment, the second mask pattern 40' may have a size large enough to completely cover some or a number of components located on the bottom thereof. In an example, the second mask pattern 40' may have a size large enough to completely cover one area B of the first semiconductor layer 11 while completely covering the first mask pattern 20', the first electrode 15, the second semiconductor layer 13, and the active layer 12. The one area B of the first semiconductor layer 11 may be a first area 11*a* immediately adjacent to the active layer 12. In case that viewed on a section, a width W2 of the second mask pattern 40' may be greater than a width W1 of the first mask pattern 20'.

Referring to FIGS. 1 to 12, the first surface SF1 of the support substrate 1 is exposed by performing a second etching process using the second mask pattern 40' as an etching mask, and light emitting stack patterns 10 are formed, which are spaced apart from each other at a micrometer scale distance.

A second groove part HM2 may be formed in the above-described second etching process. The second groove part HM2 may have a shape recessed down to the first surface SF1 of the support substrate 1 along the opposite direction of the third direction DR3 from the second mask pattern 40'.

A dry etching technique such as reactive ion etching (RIE), reactive ion beam etching (RIBE), or inductively coupled plasma reactive ion etching (ICP-RIE) may be used in the above-described second etching process.

Another area of the first semiconductor layer 11, which is not covered by the second mask pattern 40', is etched in the above-described second etching process, and therefore, a slope of a side 11" of the another area of the first semiconductor layer 11 may be steeper than a slope of a side 11_1 of the first area 11*a* of the first semiconductor layer 11, which is covered by the second mask pattern 40'.

Referring to FIGS. 1 to 13, a third etching process using the second mask pattern 40' as an etching mask is continuously performed such that other areas of the first semiconductor layer 11 have sides of which slopes are different from each other.

A wet etching technique in which anisotropic etching and isotropic etching are simultaneously performed may be used in the above-described third etching process. In an example, in the third etching process, wet etching may be performed at a temperature of approximately 80 for 30 minutes or so by using a tetramethylammonium hydroxide (TMAH) etchant used in anisotropic wet etching. A concentration of the TMAH etchant may be 20% or so. The conditions of the wet etching are not limited to the above-described embodiment. In an embodiment, a concentration of the TMAH etchant, an etching processing temperature, an etching processing time, and the like may be adjusted.

In case that the wet etching is performed, a third area 11*c* of the first semiconductor layer 11, which is located distant from the first area 11*a* of the first semiconductor layer 11, among the other areas of the first semiconductor layer 11 may be etched to have a side 11_3 of which a slope is perpendicular, and a second area 11*b* of the first semiconductor layer 11, which is adjacent to the first area 11*a*, may be etched more slowly than the third area 11*c*. Accordingly, the second area 11*b* of the first semiconductor layer 11 may be further etched inwardly of the side 11_1 of the first area 11*a* to have a side 11_2 inclined in the opposite direction of the direction in which the side 11_1 of the first area 11*a* is inclined. Since the second area 11*b* of the first semiconductor layer 11, which is adjacent to the second mask pattern 40', has an etching speed slower than an etching speed of the third area 11*c* of the first semiconductor layer 11, the side 11_3 of the third area 11*c* of the first semiconductor layer 11 may be perpendicular.

As described above, that the other areas of the first semiconductor layer 11 are selectively etched in a side direction may result from an anisotropic etching characteristic according to a crystal face of the gallium nitride (GaN) semiconductor material as a material of the first semiconductor layer 11. In an example, in case that a wet etching process is performed by using the TMAH etchant, etching is performed on only a nitrogen face of the gallium nitride (GaN), and is not performed on a gallium face.

The other areas of the first semiconductor layer 11, which are not covered by the second mask pattern 40', are etched in the above-described third etching process, so that the first semiconductor layer 11 including the first area 11*a*, the second area 11*b*, and the third area 11*c*, which have different side slopes, may be finally formed.

The side 11_1 of the first area 11*a* may be inclined in a same direction as the side 12*c* of the active layer 12, and the side 11_2 of the second area 11*b* may be inclined in the opposite direction of the direction in which the side 12*c* of the active layer 12 is inclined. The third area 11*c* may include a straight line part parallel to the third direction DR3 (or vertical direction) in the cross-section, so that the etched side 11_3 (or sidewall) is placed on a plane perpendicular to the first surface SF1 of the support substrate 1. In an example, the side 11_3 of the third area 11*c* may include a straight line part parallel to the etching direction of the light emitting stack pattern 10 in the cross-section.

In an embodiment, in order to uniformly affect lateral defect influence of the light emitting element LD, the third area 11*c* may be etched to have a width W3 constant in the third direction DR3.

Referring to FIGS. 1 to 14, the second mask pattern 40' and the first mask pattern 20' are removed by using an ordinary wet etching or dry etching method.

Referring to FIGS. 1 to 15, an insulating material layer 14' is over the light emitting stack pattern 10. The insulating material layer 14' may be a base material of an insulating film 14. The insulating material layer 14' may include an upper insulating material layer, a side insulating material layer, and a lower insulating e material layer. The upper insulating material layer may completely cover an upper surface of each of the light emitting stack patterns 10. The side insulating material layer may completely cover a side of each of the light emitting stack patterns 10. The lower insulating material layer may completely cover the first surface SF1 of the support substrate 1, which is exposed to the outside by the second groove part HM2.

The upper insulating material layer, the side insulating material layer, and the lower insulating material layer may be connected to each other on the light emitting stack patterns 10 and the support substrate 1 and be continued.

The method of forming the insulating material layer 14' may use a method of coating an insulating material over the light emitting stack patterns 10, but the disclosure is not limited thereto. The insulating material layer 14' may include a transparent insulating material.

Referring to FIGS. 1 to 16, the insulating film 14 is formed by removing a portion of the insulating material layer 14' through an etching process. The above-described etching process may be a wet etching process.

The insulating film 14 including only the side insulating material layer covering the side of each light emitting stack pattern 10 may be finally formed by removing the upper insulating material layer and the lower insulating material layer through the above-described etching process.

Semiconductor structures LD' including the light emitting stack patterns 10 and the insulating film 14 surrounding an outer circumferential surface (or surface) of each of the light emitting stack patterns 10 may be formed through the above-described etching process.

Referring to FIGS. 1 to 17, a second electrode 16 is formed on each of the semiconductor structures LD'. The second electrode 16 may be formed on the first electrode 15, to serve as a reflective member which guides and collimates light toward the first electrode 15 from the active layer 12 in a desired direction. The second electrode 16 may be formed through a photolithography process using the second electrode 16 as a mask, or the like within the spirit and the scope of the disclosure. The second electrode 16 may include an opaque metal.

Light emitting elements LD including the second electrode 16 formed on each of the semiconductor structure LD' may be finally formed through the above-described process.

Figure 18:
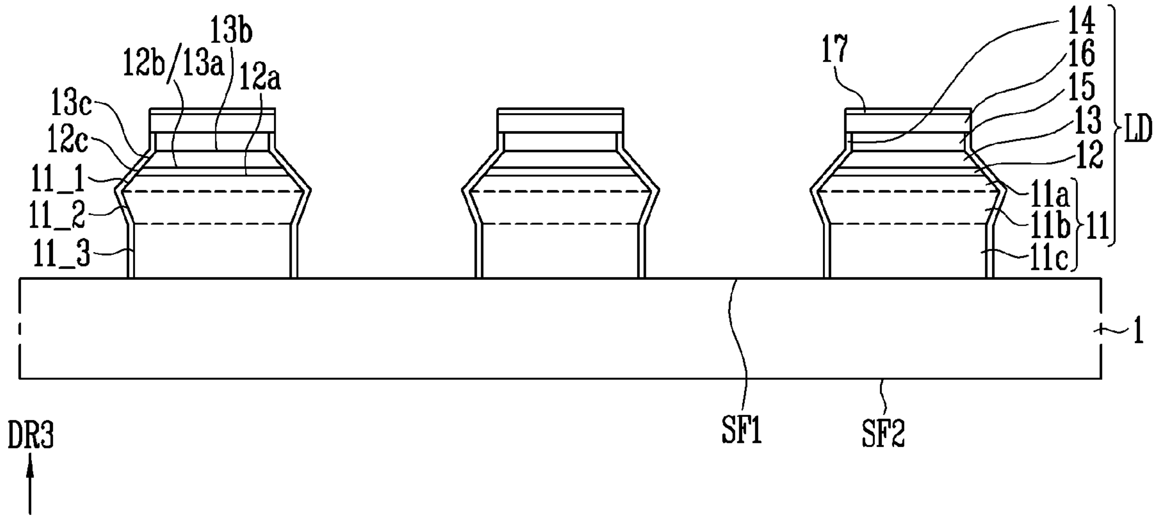

In an embodiment, the light emitting elements LD may further include an additional electrode formed on the second electrode 16. In an example, the light emitting elements LD may further include a third electrode 17 formed on the second electrode 16 as shown in FIG. 18. The third electrode 17 may be a bonding electrode for bonding the light emitting elements LD to a pixel electrode (see "AE" shown in FIG. 25) of a display device (see "DD" shown in FIG. 21). The third electrode 17 may be selected from gold (Au), tin (Sn), and the like, which have an excellent bonding force (or adhesion force) to facilitate generation and growth of an intermetallic compound. However, the disclosure is not limited thereto.

In the light emitting elements LD formed through the above-described process, the first semiconductor layer 11 in which the slopes of the sides 11_1, 11_2, and 11_3 of the first, second, and third areas 11*a*, 11*b*, and 11*c* are different from one another may be formed by consecutively performing dry etching or a wet etching. As the second and third areas 11*b* and 11*c* of the first semiconductor layer 11 are exposed to the outside in the second etching process, an atom of each of the side 11_2 of the second area 11*b* and the side 11_3 of the third area 11*c* is partially missing, and therefore, a vacancy may be generated. Defect parts of the second area 11*b* and the third area 11*c* may be controlled by consecutively performing the third etching process using wet etching after the second etching process. By way of example, as the side 11_3 of the third area 11*c* of the first semiconductor layer 11 is placed on a plane perpendicular to the first surface SF1 of the support substrate 1, a lateral defect of the light emitting element LD is readily controlled, so that the reliability of the light emitting element LD may be improved. As the first semiconductor layer 11 has different side slopes with respect to areas, a contact area with an electrode (for example, the common electrode (see "CE" shown in FIG. 25) varies, thereby readily controlling the light efficiency of the light emitting elements LD.

The light emitting elements LD formed on the support substrate 1 may be cut along a cutting line by using laser or the like, or be separated into pieces through an etching process. The light emitting elements LD may be separated from the support substrate 1 through a Laser Lift Off (LLO) process.

The light emitting elements LD on the support substrate 1 may be transferred to a first film, a second film, and the like to be retransferred to a pixel circuit layer (see "PCL" shown in FIG. 25) of the display device DD. The first and second films may be components for providing the light emitting elements LD at positions before a subsequent process (for example, a process of transferring (or disposing) the light emitting elements LD formed on the support substrate 1 onto the pixel circuit layer PCL) is performed. An adhesive material may be coated on surfaces of the first and second films such that the first and second films may be attached to the light emitting elements LD.

After the first film is disposed on the top of the light emitting elements LD on the support substrate 1, the light emitting elements LD may be separated from the support substrate 1 by using a method such as Laser Lift Off (LLO) or Chemical Lift Off (CLO). The positions of the light emitting elements LD separated from the support substrate 1 may be temporarily fixed on the first film. The third electrode 17 (or a first end portion EP1) of each of the light emitting elements LD may be in contact with the first film.

The second film may be disposed on the bottom of the light emitting elements LD on the first film, thereby retransferring the light emitting elements LD to the second film. The second film may be a component provided to expose the third electrode 17 of each of the light emitting elements LD to the outside. The adhesive force of the first film may be weakened by irradiating later onto the first film or applying heat to the first film. Therefore, the first film may be separated from the light emitting elements LD. The positions of the light emitting elements LD separated from the first film may be arbitrarily fixed on the second film. The first semiconductor layer 11 (or a second end portion EP2) of each of the light emitting elements LD may be in contact with the second film, and the third electrode 17 (or the first end portion EP1) of each of the light emitting elements LD may be exposed.

The light emitting elements LD transferred to the second film (or a transfer base) may be moved to the pixel circuit layer PCL by a transportation device or the like, to be bonded to the pixel electrode AE.

Figure 19:
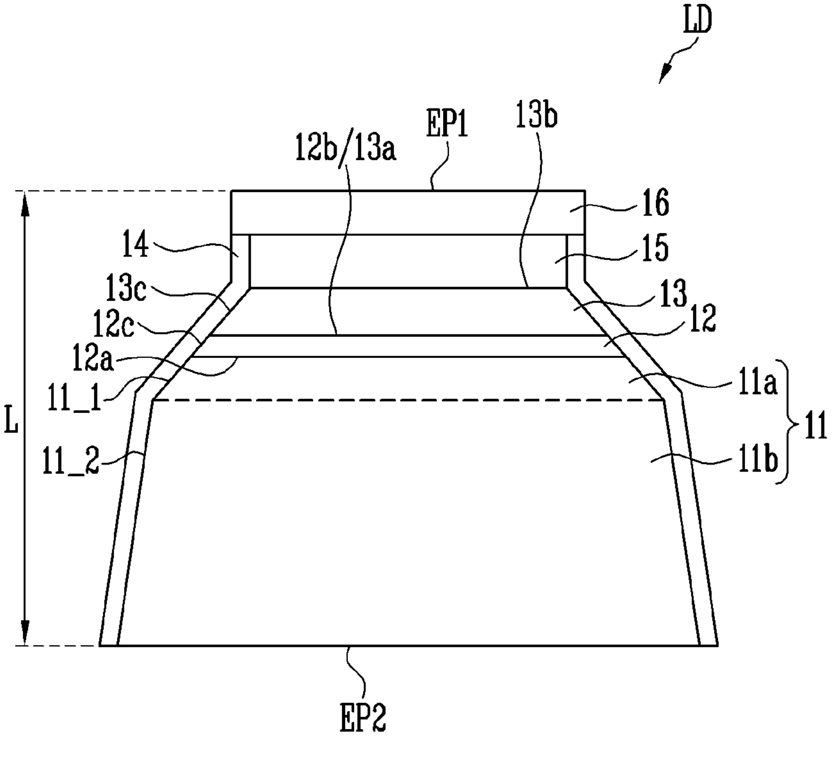
FIGS. 19 and 20 are schematic cross-sectional views illustrating a light emitting element in accordance with an embodiment.
Figure 20:
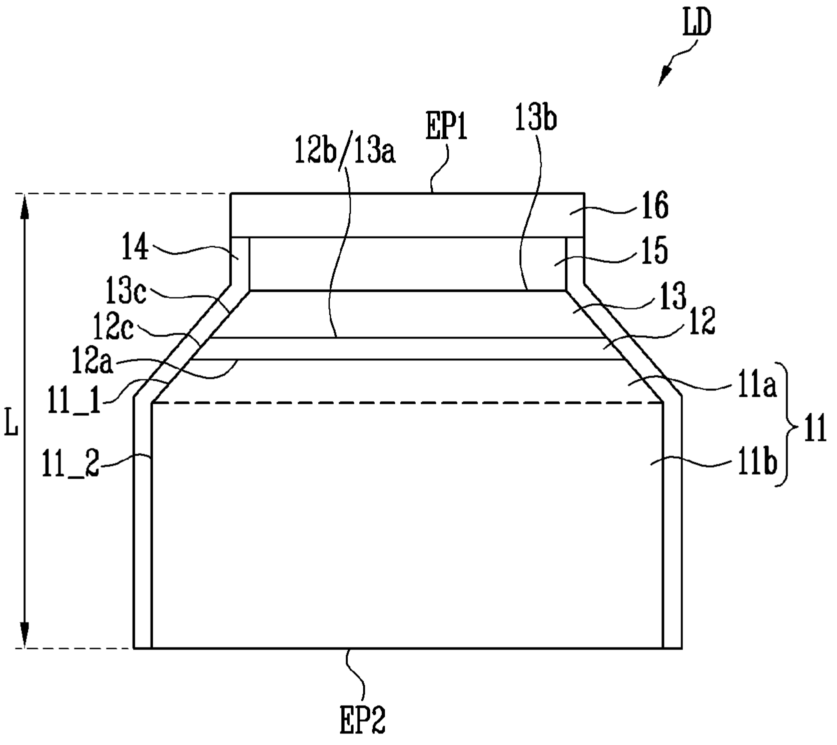

FIGS. 19 and 20 are schematic cross-sectional views illustrating a light emitting element LD in accordance with an embodiment.

In FIGS. 19 and 20, portions different from the portions of the above-described embodiment will be described to avoid redundancy.

Referring to FIGS. 19 and 20, the light emitting element LD may be implemented as a vertical light emitting stack pattern in which a first semiconductor layer 11, an active layer 12, a second semiconductor layer 13, a first electrode 15, and a second electrode 16 may be sequentially stacked each other. The light emitting element LD may include an insulating film 14 surrounding an outer circumferential surface of the light emitting stack pattern.

The light emitting element LD may have a pillar-like shape in which a diameter of a first end portion EP1 is smaller than a diameter of a second end portion EP2.

The first semiconductor layer 11 may include a first area 11*a* and a second area 11*b*, which are partitioned along a direction toward the second end portion EP2 of the light emitting element LD from a first surface 12*a* of the active layer 12. The first area 11*a* may be one area of the first semiconductor layer 11, which is immediately adjacent to the active layer 12, and the second area 11*b* may be the other area of the first semiconductor layer 11, which is immediately adjacent to the second end portion EP2 of the light emitting element LD.

Figure 13:
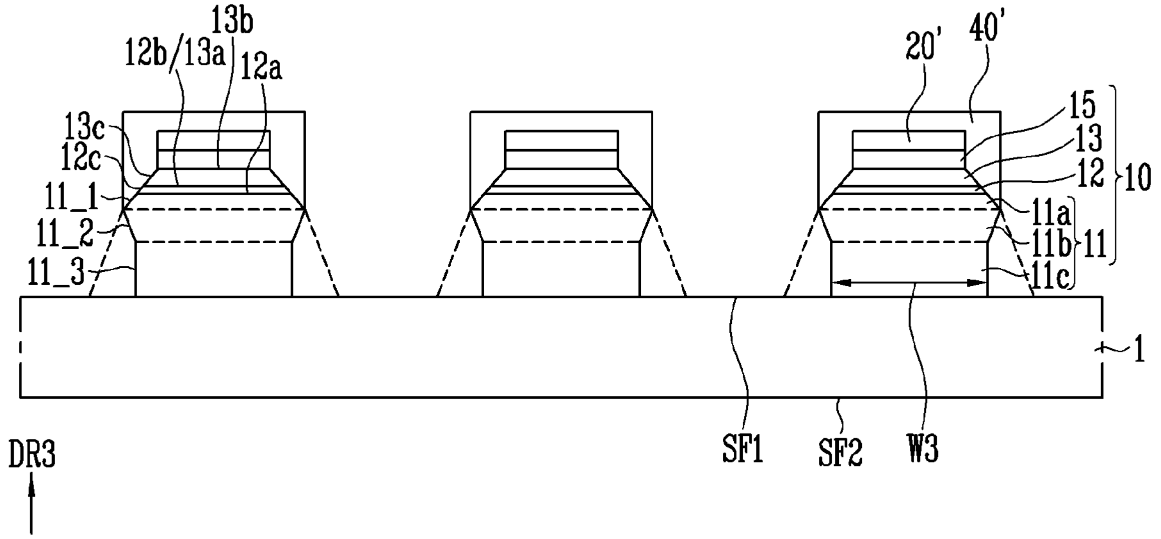
Figure 14:
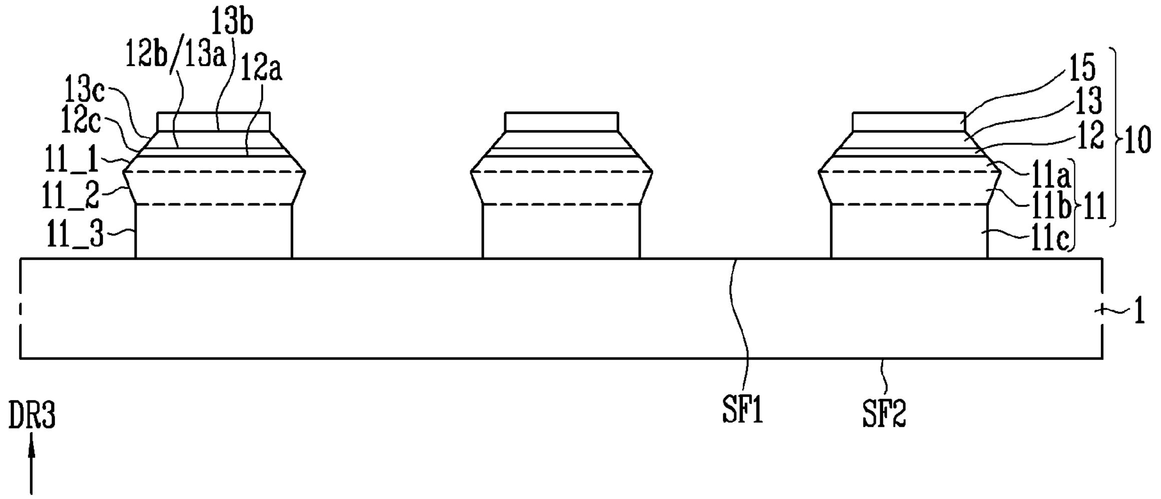
Figure 15:
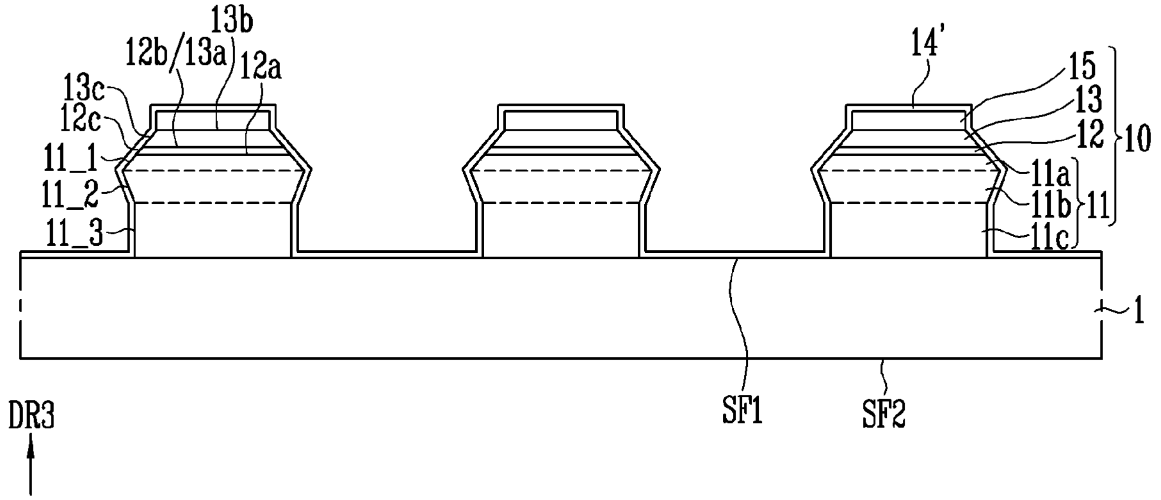
Figure 16:
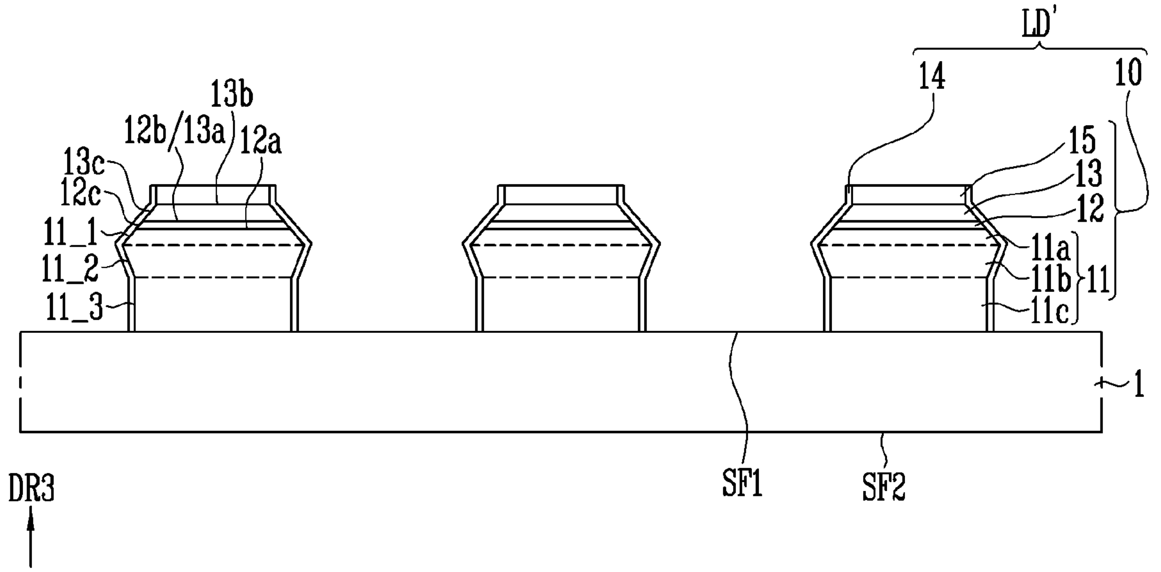
Figure 17:
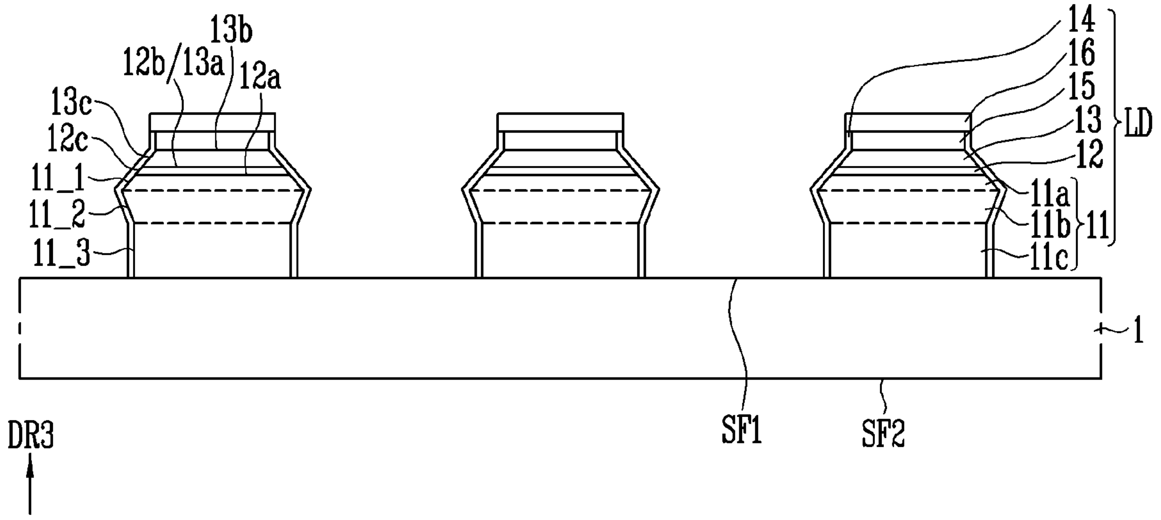

The first semiconductor layer 11 may have different side slopes with respect to areas by adjusting a concentration of an etchant, a processing time, and/or a processing temperature in the wet etching performed in the third etching process described with reference to FIG. 13.

A slope of a side 11_1 of the first area 11*a* may be equal to a slope of a side 12*c* of the active layer 12, and a slope of a side 11_2 of the second area 11*b* may be different from the slope of the side 12*c* of the active layer 12. The side 11_1 of the first area 11*a* may not be located on a same line with the side 11_2 of the second area 11*b* in the cross-section. In an example, as shown in FIG. 19, the side 11_1 of the first area 11*a* may be inclined in a same direction as the side 12*c* of the active layer 12, and the side 11_2 of the second area 11*b* may be inclined in a direction different from the direction in which the side 12*c* of the active layer 12 is inclined. The slope of the side 11_2 of the second area 11*b* may be steeper than the slope of the side 11_1 of the first area 11*a*. In another example, as shown in FIG. 20, the side 11_1 of the first area 11*a* may be inclined in a same direction as the side 12*c* of the active layer 12, and the side 11_2 of the second area 11*b* may not be inclined, including a straight line part parallel to a length direction of the light emitting element LD in the cross-section.

A light emitting unit (light emitting device or light emitting part) including the above-described light emitting element LD may be used in various types of electronic devices that require a light source, including a display device. For example, the light emitting element LD may be disposed in a pixel area of each pixel of a display panel to be used as a light source of the pixel. However, the application field of the light emitting element LD is not limited to the above-described example. For example, the light emitting element LD may be used for other types of electronic devices that require a light source, such as a lighting device.

In the following embodiment, for convenience of description, a lateral direction (or X-axis direction) on a plane is represented as a first direction DR1, a longitudinal direction (or Y-axis direction) on the plane is represented as a second direction DR2, and a longitudinal direction on a section is represented as a third direction DR3.

Figure 21:
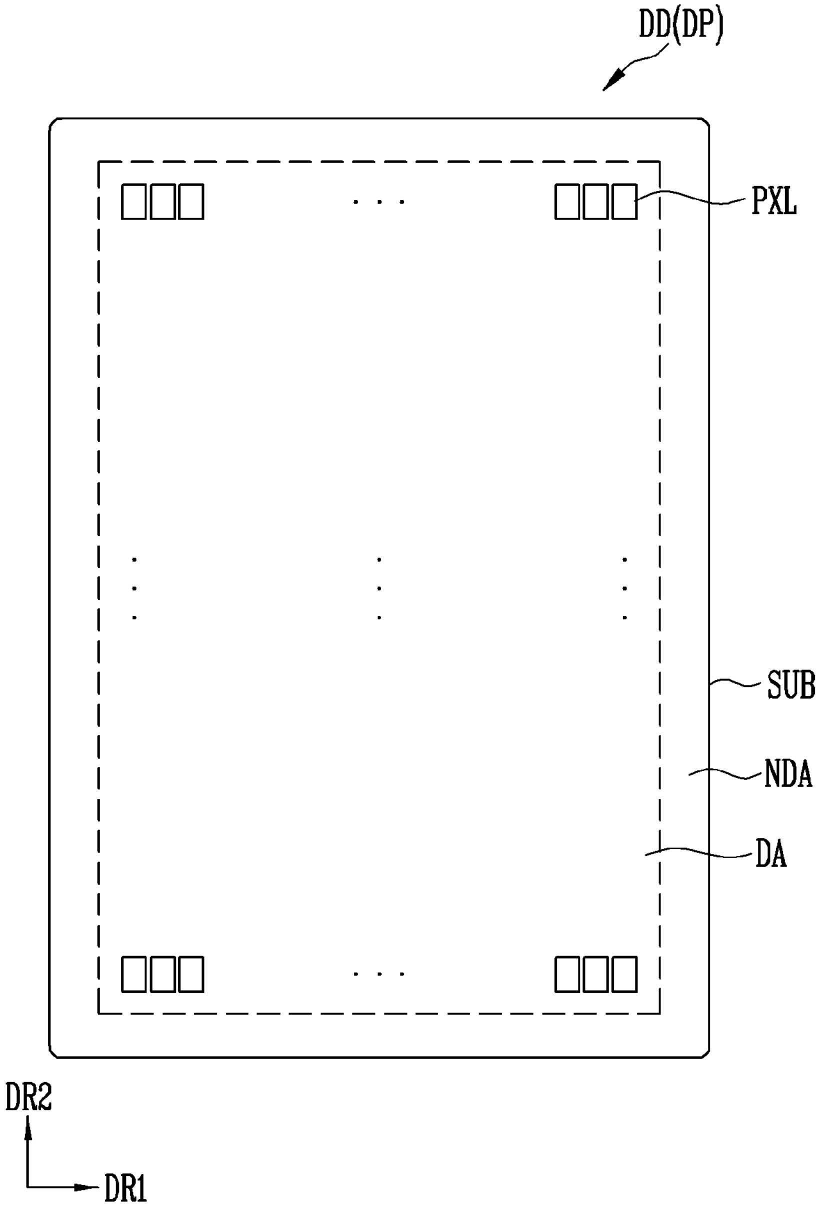
FIG. 21 is a schematic plan view illustrating a display device in accordance with an embodiment.
Figure 22:
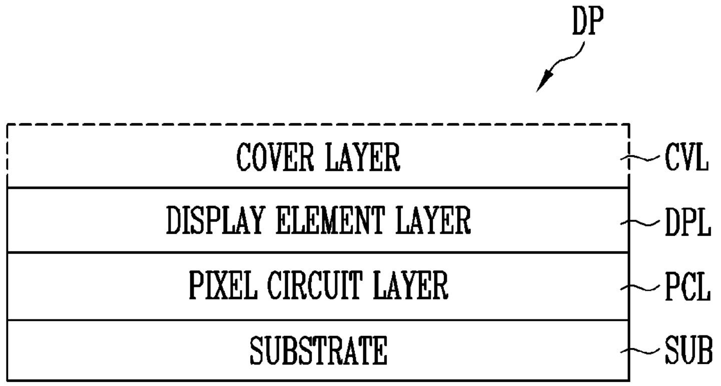
FIGS. 22 and 23 are schematic cross-sectional views illustrating a display panel shown in FIG. 21.
Figure 23:
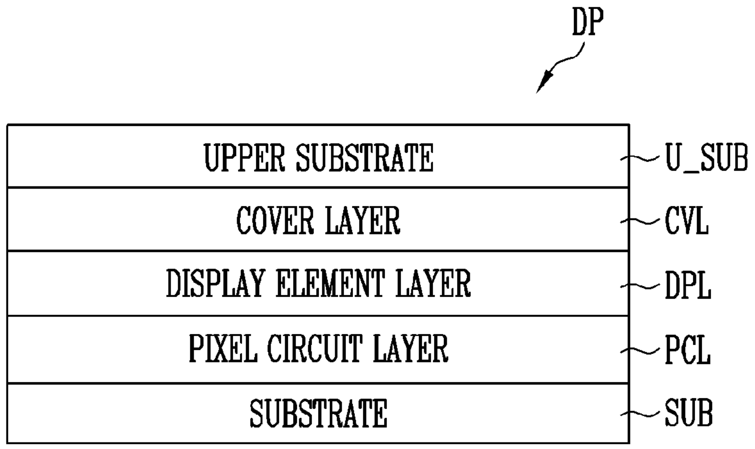

FIG. 21 is a schematic plan view illustrating a display device DD in accordance with an embodiment. FIGS. 22 and 23 are schematic cross-sectional views illustrating a display panel DP shown in FIG. 21.

In FIG. 21, for convenience of description, a structure of the display device DD, by way of example, the display panel DP provided in the display device DD is briefly illustrated based on a display area DA in which an image is displayed.

The disclosure may be applied as long as the display device DD is an electronic device in which a display surface is applied to at least one surface or a surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIGS. 21 to 23, the display device DD may be provided in various shapes. In an example, the display device may be provided in a rectangular plate shape having two pairs of sides parallel to each other, but the disclosure is not limited thereto. In case that the display device DD is provided in the rectangular plate shape, any one pair of sides among the two pairs of sides may be provided longer than the other pair of sides.

The display panel DP (or the display device DD) may include a substrate SUB and pixels PXL.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

One area on the substrate SUB may be provided as the display area DA such that the pixels PXL are disposed therein, and the other area on the substrate SUB may be provided as a non-display area NDA. In an example, the substrate SUB may include the display area DA including pixel areas in which the respective pixels PXL are disposed and the non-display area NDA disposed at the periphery of the display area DA (or adjacent to the display area DA). The display area DA may be an area in which the pixels PXL are provided to display an image. The non-display area NDA is an area in which the pixels PXL are not provided, and may be an area in which the image is not displayed.

The non-display area NDA may be located adjacent to the display area DA. The non-display area NDA may be provided at at least one side or a side of the display area DA. In an example, the non-display area NDA may surround a circumference (or edge) of the display area DA. A line part electrically connected to each pixel PXL and a driver which is electrically connected to the line part and drives the pixel PXL may be provided in the non-display area NDA.

Each of the pixels PXL may be provided in the display area DA of the substrate SUB. In an embodiment, the pixels PXL may be arranged (or disposed) in a stripe arrangement structure or the like in the display area DA, but the disclosure is not limited thereto.

As shown in FIG. 22, the display panel DP may include a pixel circuit layer PCL, a display element layer DPL, and a cover layer CVL, which are sequentially located on the substrate SUB.

The pixel circuit layer PCL may be provided on the substrate SUB, and include transistors and signal lines electrically connected to the transistors. For example, each transistor may have a form in which a semiconductor layer, a gate electrode, a first terminal, and a second terminal may be sequentially stacked each other with an insulating layer interposed therebetween. The semiconductor layer may include amorphous silicon, poly-silicon, low temperature poly-silicon, and an organic semiconductor. The gate electrode, the first terminal, and the second terminal may include one of aluminum (Al), copper (Cu), titanium (Ti), and molybdenum (Mo), but the disclosure is not limited thereto. Also, the pixel circuit layer PCL may include at least one insulating layer.

The display element layer DPL may be disposed on the pixel circuit layer PCL. The display element layer DPL may include a light emitting element emitting light. The light emitting element may be, for example, an organic light emitting diode, an inorganic light emitting element including an inorganic light emitting material, or a light emitting element emitting light by changing a wavelength of light emitted, using a quantum dot.

The cover layer CVL may be selectively disposed on the display element layer DPL. The cover layer CVL may be an encapsulation substrate or have the form of an encapsulation layer provided as a multi-layer. In case that the cover layer CVL has the form of the encapsulation layer, the cover layer CVL may include an inorganic layer and/or an organic layer. For example, the cover layer CVL may have a form in which an inorganic layer, an organic layer, and an inorganic layer may be sequentially stacked each other. The cover layer CVL may prevent external air and moisture from infiltrating into the display element layer DPL and the pixel circuit layer PCL.

In an embodiment, as shown in FIG. 23, an upper substrate U_SUB may be disposed on the cover layer CVL. The upper substrate U_SUB may include a light conversion pattern (layer) which changes a wavelength (or color) of light emitted from the display element layer DPL by using a quantum dot, and allows light having a specific wavelength (or specific or given color) to be selectively transmitted therethrough by using a color filter. The upper substrate U_SUB may be formed on the substrate SUB on which the display element layer DPL is provided through an adhesion process using an adhesive layer. The upper substrate U_SUB will be described later with reference to FIG. 27.

Although a case where the light conversion pattern is provided separately from the display element layer DPL is described, the disclosure is not limited thereto. For example, the light emitting element provided in the display element layer DPL may be implemented as a light emitting element emitting light by changing a wavelength of light emitted, using a quantum dot.

Figure 24:
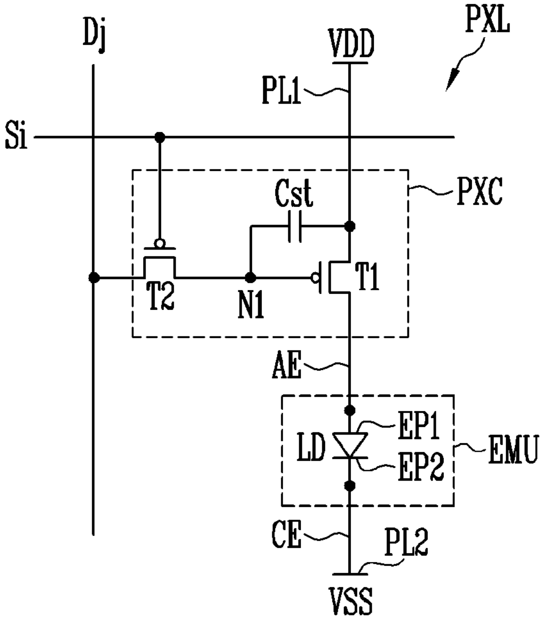
FIG. 24 is a schematic circuit diagram illustrating an electrical connection relationship of components included in each pixel shown in FIG. 21 in accordance with an embodiment.

FIG. 24 is a schematic circuit diagram illustrating an electrical connection relationship of components included in each pixel shown in FIG. 21 in accordance with an embodiment of the disclosure.

For example, FIG. 24 illustrates an electrical connection relationship of components included in a pixel PXL applicable to an active matrix type display device in accordance with an embodiment. However, the kinds of the components included in the pixel PXL applicable to an embodiment are not limited thereto. The pixel PXL shown in FIG. 24 may be one of the pixels PXL provided in the display panel DP shown in FIG. 21.

Referring to FIGS. 21 to 24, the pixel PXL may include an emission component EMU which generates light with a luminance corresponding to a data signal. Also, the pixel PXL may selectively further include a pixel circuit PXC for driving the emission component EMU.

The emission component EMU may include a light emitting element LD electrically connected between a first power line PL1 to which a voltage of a first driving power source VDD is applied and a second power line PL2 to which a voltage of a second driving power source VSS is applied. In an example, the emission component EMU may include at least one light emitting element LD electrically connected between a pixel electrode AE and a common electrode CE. In an embodiment, the pixel electrode AE is an anode, and the common electrode CE may be a cathode.

The light emitting element LD included in the emission component EMU may include a first end portion EP1 electrically connected to the first driving power source VDD through the pixel electrode AE and a second end portion EP2 electrically connected to the second driving power source VSS through the common electrode CE. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting element LD during an emission period of the pixel PXL.

As described above, the light emitting element LD electrically connected between the pixel electrode AE and the common electrode CE, to which voltages having different potentials are respectively supplied may form an effective light source, and implement an emission component EMU of each pixel PXL.

The light emitting element LD may emit light with a luminance corresponding to a driving current supplied through the pixel circuit PXC. For example, the pixel circuit PXC may supply, to the emission component EMU, a driving current corresponding to a grayscale value of corresponding frame data during each frame period. The driving current supplied to the emission component EMU may flow through the light emitting element LD. Accordingly, the emission component EMU may emit light while the light emitting element LD emits light with a luminance corresponding to the driving current.

The pixel circuit PXC may be electrically connected to a scan line Si and a data line Dj of the pixel PXL. In an example, in case that a pixel PXL is disposed on an ith (i is a natural number) row and a jth (j is a natural number) column of the display area DA of the display panel DP (or the substrate SUB), a pixel circuit PXC of the pixel PXL may be electrically connected to an ith scan line Si and a jth data line Dj of the display area DA. In an embodiment, the pixel circuit PXC may include first and second transistors T1 and T2 and a storage capacitor Cst. However, the structure of the pixel circuit PXC is not limited to the embodiment shown in FIG. 24.

The first transistor T1 is a driving transistor for controlling the driving current applied to the emission component EMU, and may be electrically connected between the emission component EMU and the first driving power source VDD. For example, a first terminal of the first transistor T1 may be electrically connected to the emission component EMU, a second terminal of the first transistor T1 may be electrically connected to the first driving power source VDD through the first power line PL1, and a gate electrode of the first transistor T1 may be electrically connected to a first node N1. The first transistor T1 may control an amount of driving current flowing from the first driving power source VDD to the emission component EMU according to a voltage applied to the first node N1.

The second transistor T2 is a switching transistor which selects a pixel PXL in response to a scan signal applied to the scan line Si and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals. For example, in case that the first terminal is a source electrode, and the second terminal may be a drain electrode.

The second transistor T2 is turned on in case that the scan signal having a voltage (for example, a low voltage) at which the second transistor T2 may be turned on is supplied from the scan line Si, to electrically connect the data line Dj and the first node N1 to each other. A data signal of a corresponding frame is supplied to the data line Dj. Accordingly, the data signal is transferred to the first node N1. The data signal transferred to the first node N1 is charged in the storage capacitor Cst.

One electrode of the storage capacitor Cst may be electrically connected to the first driving power source VDD, and the other electrode of the storage capacitor Cst may be electrically connected to the first node N1. The storage capacitor Cst may store a data voltage corresponding to the data signal supplied to the first node N1, and maintain the charged voltage until a data signal of a next frame is supplied.

Although the pixel circuit PXC including the second transistor T2 for transferring a data signal to the inside of the pixel PXL, the storage capacitor Cst for storing the data signal, and the first transistor T1 for supplying a driving current corresponding to the data signal to the light emitting element LD is illustrated in FIG. 24, the disclosure is not limited thereto, and the structure of the pixel circuit PXC may be variously modified.

Figure 25:
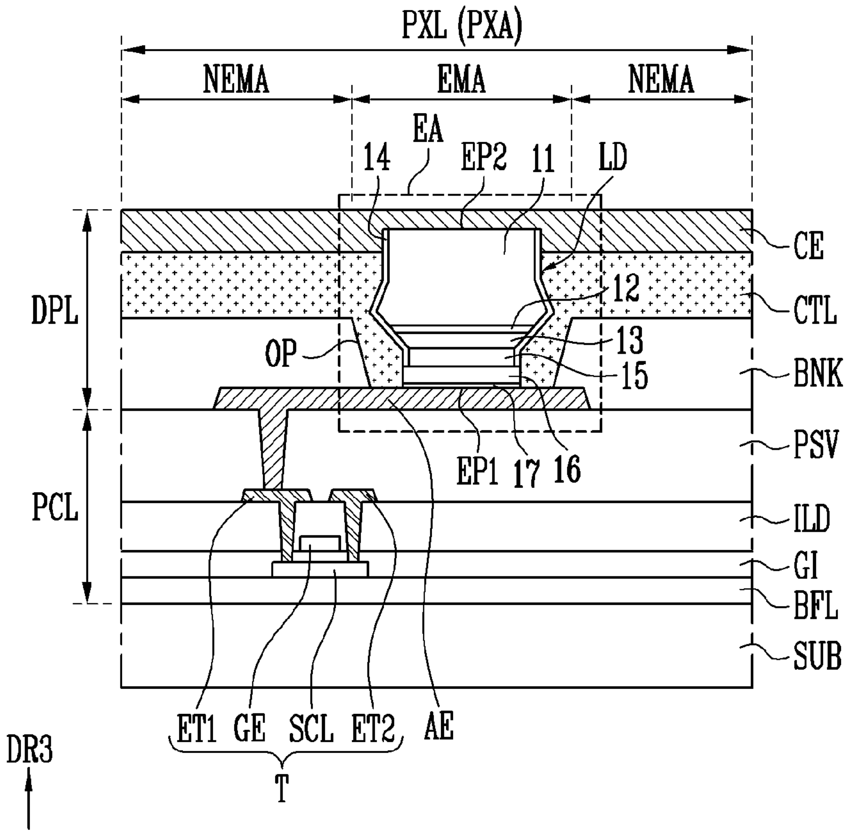
FIGS. 25 to 27 are schematic cross-sectional views illustrating a pixel in accordance with an embodiment.
Figure 26:
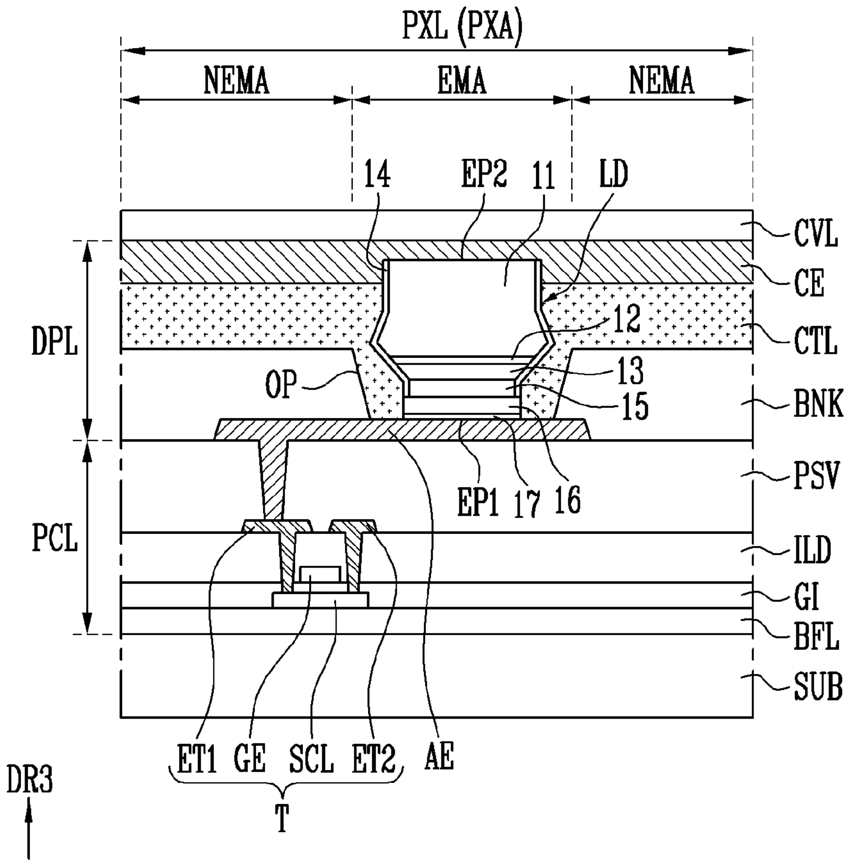
Figure 27:
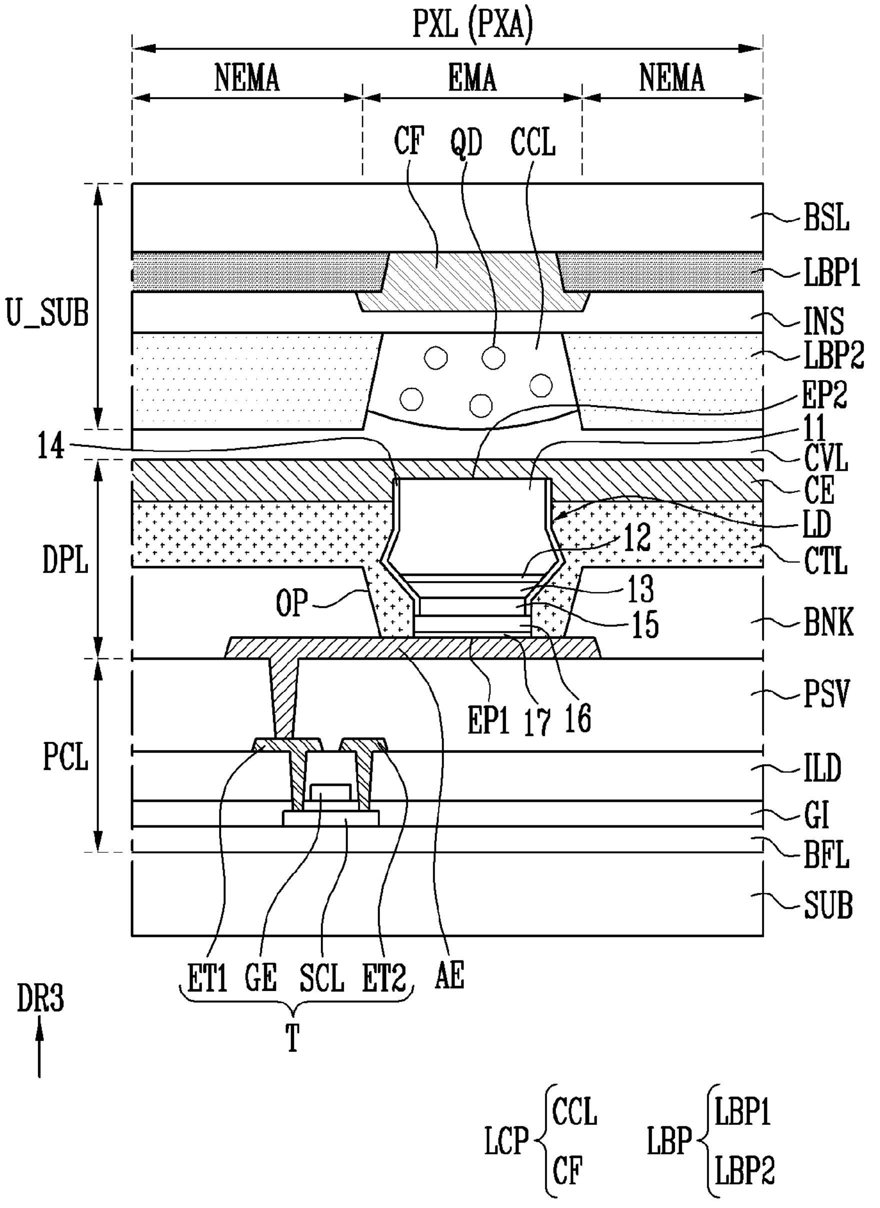
Figure 28:
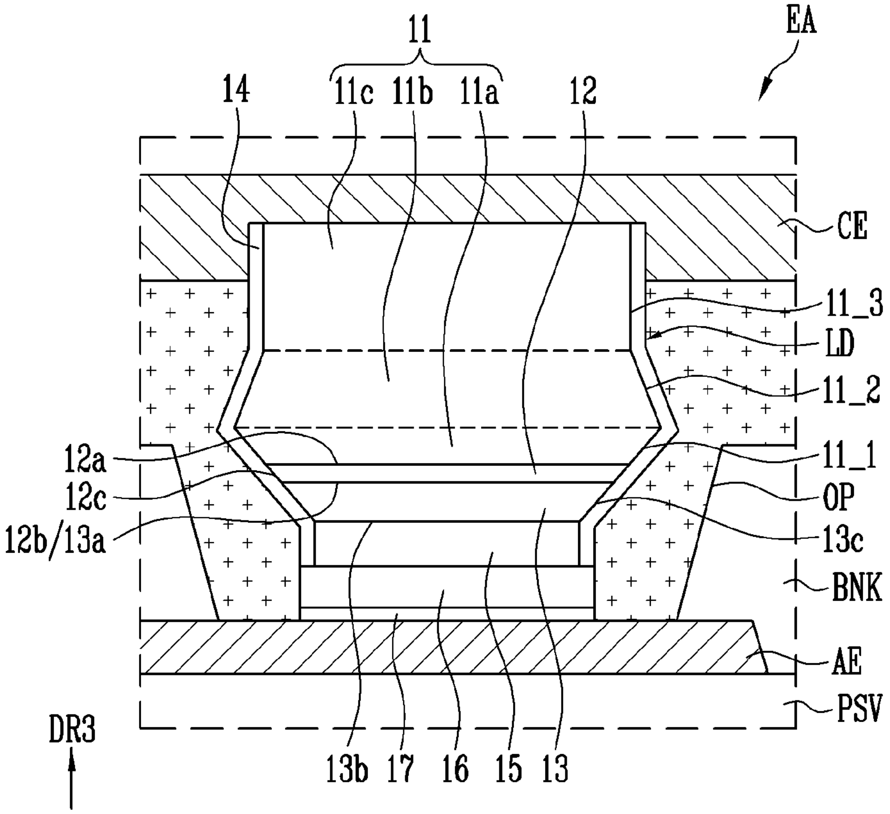
FIG. 28 is a schematic enlarged view illustrating portion EA shown in FIG. 25.

FIGS. 25 to 27 are schematic cross-sectional views illustrating a pixel PXL in accordance with an embodiment. FIG. 28 is a schematic enlarged view illustrating portion EA shown in FIG. 25.

Although the pixel PXL is simplified and illustrated in FIGS. 25 to 28, the disclosure is not limited thereto.

Embodiments shown in FIGS. 26 and 27 illustrate modifications of the embodiment shown in FIG. 25 in relation to components disposed on a common electrode CE.

Referring to FIGS. 21 and 24 to 28, the pixel PXL in accordance with an embodiment may be disposed in a pixel area PXA provided on a substrate SUB. The pixel area PXA is one area or an area of the display area DA, and may include an emission area EMA and a non-emission area NEMA.

The pixel PXL may include the substrate SUB, a pixel circuit layer PCL, and a display element layer DPL.

The substrate SUB may include a transparent insulating material to allow light to be transmitted therethrough. The substrate SUB may be a rigid substrate or a flexible substrate.

Circuit elements (for example, a transistor T) and signal lines electrically connected to the circuit elements, which constitute a pixel circuit PXC, may be disposed in the pixel circuit layer PCL. The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, and a passivation layer PSV, which may be sequentially stacked each other on the substrate SUB along the third direction DR3.

The buffer layer BFL may be entirely disposed on the substrate SUB. The buffer layer BFL may prevent an impurity from being diffused into transistors T included in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_x N_y$), and aluminum oxide ($AlO_x$). The buffer layer BFL may be provided as a single layer, but be provided as a multi-layer including at least two layers. In case that the buffer layer BFL is provided as the multi-layer, the layers may be formed of a same material or a similar material or be formed of different materials. The buffer layer BFL may be omitted according to a material of the substrate SUB, a process condition, and the like within the spirit and the scope of the disclosure.

The gate insulating layer GI may be entirely disposed on the buffer layer BFL. The gate insulating layer GI may include a same material or a similar material as the above-described buffer layer BFL, or include an appropriate (or selected) material among the materials as the material constituting the buffer layer BFL. In an example, the gate insulating layer GI may be an inorganic insulting layer including an inorganic material.

The interlayer insulating layer ILD may be entirely provided and/or formed on the gate insulating layer GI. The interlayer insulating layer ILD may include a same material or a similar material as the above-described buffer layer BFL, or include an appropriate (or selected) material among the materials as the material constituting the buffer layer BFL.

The passivation layer PSV may be entirely provided and/or formed on the interlayer insulating layer ILD. The passivation layer PSV may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_x N_y$), and aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The pixel circuit PXC may include at least one transistor T disposed on the buffer layer BFL. The transistor T is a driving transistor for controlling a driving current of a light emitting element LD, and may be the same component as the first transistor T1 described with reference to FIG. 24.

The transistor T may include a semiconductor pattern SCL, a gate electrode GE overlapping a portion of the semiconductor pattern SCL, and a first terminal ET1 and a second terminal ET2, which are electrically connected to the semiconductor pattern SCL.

The gate electrode GE may be provided and/or formed on the gate insulating layer GI. The gate electrode GE may overlap a portion of the semiconductor pattern SCL. In an example, the gate electrode GE may overlap an active pattern of the semiconductor pattern. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layer structure including molybdenum (Mo), titanium (Ti), copper (Cu), aluminum (Al) or silver (Ag), which is a low-resistance material so as to decrease wiring resistance.

The semiconductor pattern SCL may be provided and/or formed on the buffer layer BFL. In an example, the semiconductor pattern SCL may be located between the buffer layer BFL and the gate insulating layer GI. The semiconductor pattern SCL may be formed of poly-silicon, amorphous silicon, an oxide semiconductor, or the like within the spirit and the scope of the disclosure. The semiconductor pattern SCL may include the active pattern, a first contact region, and a second contact region. The active pattern, the first contact region, and the second contact region may be formed of a semiconductor layer undoped or doped with an impurity. In an example, the first contact region and the second contact region may be formed of a semiconductor layer doped with the impurity, and the active pattern may be formed of a semiconductor layer undoped with the impurity.

The active pattern of the semiconductor pattern SCL is a region overlapping the gate electrode GE of the transistor T, and may be a channel region. The first contact region of the semiconductor pattern SCL may be in contact with one end of the active pattern. Also, the first contact region may be electrically connected to the first terminal ET1. The second contact region of the semiconductor pattern SCL may be in contact with the other end of the active pattern. Also, the second contact region may be electrically connected to the second terminal ET2.

The first terminal ET1 (or source electrode) may be provided and/or formed on the interlayer insulating layer ILD. The first terminal ET1 may be in contact with the first contact region of the semiconductor pattern SCL through a contact hole penetrating the gate insulating layer GI and the interlayer insulating layer ILD.

The second terminal ET2 (or drain electrode) may be provided and/or formed on the interlayer insulating layer ILD. The second terminal ET2 may be disposed on the interlayer insulating layer ILD to be spaced apart from the first terminal ET1. The second terminal ET2 may be in contact with the second contact region of the semiconductor pattern SCL through a contact hole penetrating the gate insulating layer GI and the interlayer insulating layer ILD.

In the above-described embodiment, a case where the transistor T is a thin film transistor having a top gate structure is described as an example. However, the disclosure is not limited thereto, and the structure of the transistor T may be variously modified.

The pixel circuit layer PCL may further include signal lines (for example, including a scan line, a data line, and the like) and power lines (for example, first and second power lines), which are electrically connected to the transistor T.

The passivation layer PSV may be disposed over the above-described transistor T. The passivation layer PSV may be partially opened to expose the first terminal ET1 of the transistor T to the outside.

The display element layer DPL may be located on the passivation layer PSV.

The display element layer DPL may include a pixel electrode AE, the light emitting element LD, and the common electrode CE.

The pixel electrode AE may be provided and/or formed on the pixel circuit layer PCL. The pixel electrode AE may be located on the bottom of the light emitting element LD, and be electrically connected to a first end portion EP1 of the light emitting element LD. The common electrode CE may be located on the top of the light emitting element LD, and be electrically connected to a second end portion EP2 of the light emitting element LD. In case that viewed on a section, the pixel electrode AE and the common electrode CE may face each other with the light emitting element LD interposed therebetween in the third direction DR3.

The pixel electrode AE may be electrically connected to the first terminal ET1 of the transistor T through a contact hole penetrating the passivation layer PSV. In an embodiment, the pixel electrode AE may be an anode.

The pixel electrode AE may include a conductive material having reflexibility so as to allow light emitted from the light emitting element LD to advance in an image display direction (or front direction) of the display device DD. The conductive material may include an opaque metal advantageous in reflecting light emitted from the light emitting element LD in the image display direction (or desired direction) of the display device DD. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In an embodiment, the pixel electrode AE may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene) (PEDOT), and the like within the spirit and the scope of the disclosure. In case that the pixel electrode AE includes a transparent conductive material (or substance), a separate conductive layer may be added, which is formed of an opaque metal for reflecting light emitted from each of light emitting elements LD in the image display direction of the display device DD. However, the material of the pixel electrode AE is not limited to the above-described materials.

The pixel electrode AE may be provided and/or formed as a single layer, but the disclosure is not limited thereto. In an embodiment, the pixel electrode AE may be provided and/or formed as a multi-layer in which at least two materials among metals, alloys, conductive oxide, and conductive polymers may be stacked each other. The pixel electrode AE may be formed as a multi-layer including at least two layers so as to minimize distortion caused by a signal delay in case that a signal (or voltage) is transferred to the first end portion EP1 of the light emitting element LD. In case that the pixel electrode AE is formed as the multi-layer, a layer located as an uppermost layer among the layers may be used as a bonding metal bonded to the light emitting element LD, but the disclosure is not limited thereto.

A bank BNK may be provided and/or formed on the pixel electrode AE.

The bank BNK may be a pixel defining layer which is located in the non-emission area NEMA and partitions the emission area EMA of the pixel PXL. The bank BNK may include an opening OP exposing a portion of the pixel electrode AE. In an example, the bank BNK may be partially opened to expose one area of the pixel electrode AE. In an embodiment, the emission area EMA of the pixel PXL and the opening OP of the bank BNK may correspond to each other.

The bank BNK may include at least one light blocking material and/or a reflective material (or scattering material), thereby preventing a light leakage defect in which light is leaked between adjacent pixels PXL. In an embodiment, the bank BNK may be an organic insulating layer including an organic material. In an example, the bank BNK may be formed of an organic insulating layer including acrylic resin, epoxy resin, phenolic resin, polyamide resin, polyimide resin, and the like within the spirit and the scope of the disclosure. Also, in an embodiment, the bank BNK may include a transparent material. The transparent material may include, for example, polyamide-based resin, polyimide-based resin, and the like within the spirit and the scope of the disclosure. In other embodiments, a reflective material layer may be separately provided and/or formed on the bank BNK so as to further improve the efficiency of light emitted from the pixel PXL.

An intermediate layer CTL may be provided and/or formed on the bank BNK.

The intermediate layer CTL may be entirely coated on the bank BNK through spin coating. In an embodiment, the intermediate layer CTL may be provided on the bank BNK in a form filling the opening OP.

The intermediate layer CTL may include an organic material for reinforcing adhesion between the light emitting element LD and the pixel electrode AE while stably fixing the light emitting element LD. In an example, the intermediate layer CTL may be a transparent adhesive layer (or gluing layer), but the disclosure is not limited thereto. The intermediate layer CTL may be formed of an organic material. The organic material may include, for example, at least one of a photocurable resin including a photopolymerization initiator cross-linked or cured by light such as UV or a thermosetting resin including a thermal polymerization initiator which allows a curing reaction to be initiated by heat. For example, the thermosetting resin may include epoxy resin, amino resin, phenolic resin, polyester resin, and the like, which may include an organic material. The intermediate layer CTL may be cured by light or heat in a process in which the light emitting element LD and the pixel electrode AE are bonded to each other. Accordingly, the intermediate layer CTL may prevent separation of the light emitting element LD while stably fixing the light emitting element LD.

The light emitting element LD may be provided and/or formed on the intermediate layer CTL. In an embodiment, each pixel PXL may include at least one light emitting element LD.

The light emitting element LD may include a third electrode 17, a second electrode 16, a first electrode 15, a second semiconductor layer 13, an active layer 12, and a first semiconductor layer 11, which may be sequentially stacked each other along the third direction DR3 on the pixel electrode AE. The third electrode 17 may be located at the first end portion EP1 of the light emitting element LD, and the first semiconductor layer 11 may be located at the second end portion EP2 of the light emitting element LD. The third electrode 17 may be bonded to the pixel electrode AE while being in direct contact with the pixel electrode AE. The first semiconductor layer 11 may be electrically connected to the common electrode CE while being in direct contact with the common electrode CE.

After the light emitting element LD transferred to a transfer base by a transportation device or the like is moved to the top of the intermediate layer CTL to correspond to the opening OP of the bank BNK, the light emitting element LD may be retransferred into the opening OP. In this process, the third electrode 17 of the light emitting element LD may be in direct contact with the pixel electrode AE while the intermediate layer CTL with a fluidic organic material filled inside of the opening OP is moved.

A bonding method may be used to electrically connect the light emitting element LD and the pixel electrode AE to each other. The bonding method may include an anisotropic conductive film (AFC) bonding method, a laser assist bonding (LAB) method using laser, an ultrasonic bonding method, a ball grid array (BGA) method, a thermo compression (TC) bonding method, and the like within the spirit and the scope of the disclosure. The TC bonding method may mean a method in which, after the third electrode 17 of the light emitting element LD and the pixel electrode AE are in contact with each other, the light emitting element LD and the pixel electrode AE are electrically and physically connected to each other by heating the pixel electrode AE at a temperature higher than a melting point of the pixel electrode AE and applying a pressure to the pixel electrode AE.

As described above, after the third electrode 17 and the pixel electrode AE are in contact with each other as the light emitting element LD is located in the opening OP, the light emitting element LD and the pixel electrode AE may be electrically connected to each other by performing a bonding process using the TC bonding method. In case that heat and pressure are applied to achieve bonding of the third electrode 17 and the pixel electrode AE, an intermetallic compound may be generated and grown between the third electrode 17 and the pixel electrode AE. The light emitting element LD and the pixel electrode AE may be electrically and physically connected to each other by using the intermetallic compound. However, the method of bonding the light emitting element LD and the pixel electrode AE to each other is not limited to the above-described embodiment.

The common electrode CE may be provided and/or formed over the light emitting element LD bonded to the pixel electrode AE.

The common electrode CE may be entirely formed on the second end portion EP2 of the light emitting element LD and the intermediate layer CTL. The common electrode CE may be electrically connected to the second end portion EP2 of the light emitting element LD while being in contact with the second end portion EP2 of the light emitting element LD. In an example, the common electrode CE may be electrically connected to the first semiconductor layer 11 located at the second end portion EP2 of the light emitting element LD.

The common electrode CE may include various transparent conductive materials so as to allow light emitted from the light emitting element LD to advance in the image display direction without any loss. In an example, the common electrode CE may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and be substantially transparent or translucent to satisfy a transmittance (or transmittancy). However, the material of the common electrode CE is not limited to the above-described embodiment.

The above-described common electrode CE may be electrically connected to the second power line PL2. Accordingly, the voltage of the second driving power source VSS, which is applied to the second power line PL2, may be transferred to the common electrode CE. In an embodiment, the common electrode CE may be a cathode.

In the light emitting element LD located between the pixel electrode AE and the common electrode CE, the third electrode 17, the second electrode 16, the first electrode 15, the second semiconductor layer 13, the active layer 12, and the first semiconductor layer 11 may be sequentially disposed along the third direction DR3.

Figure 9:
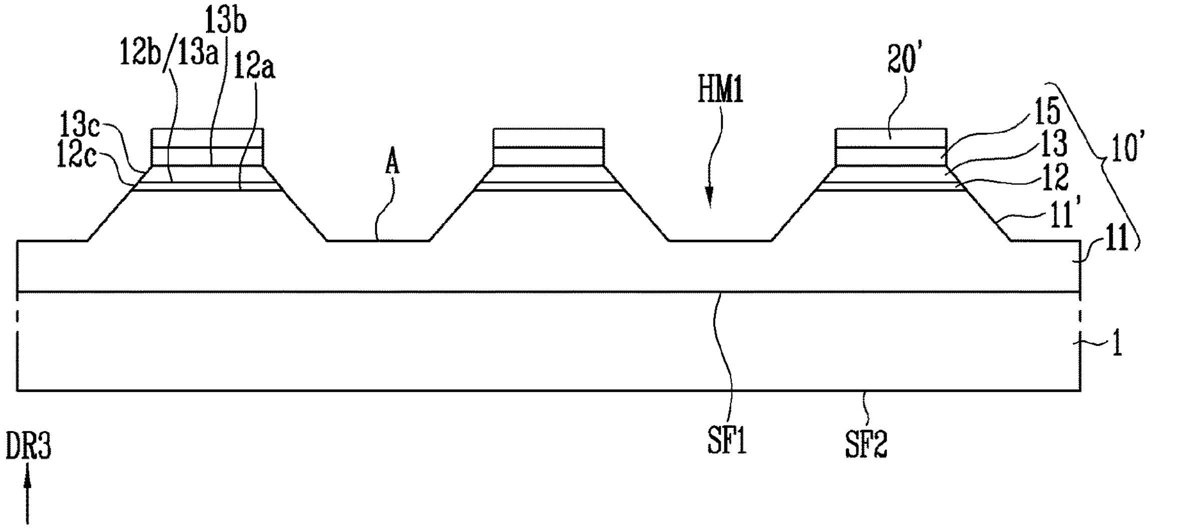
Figure 10:
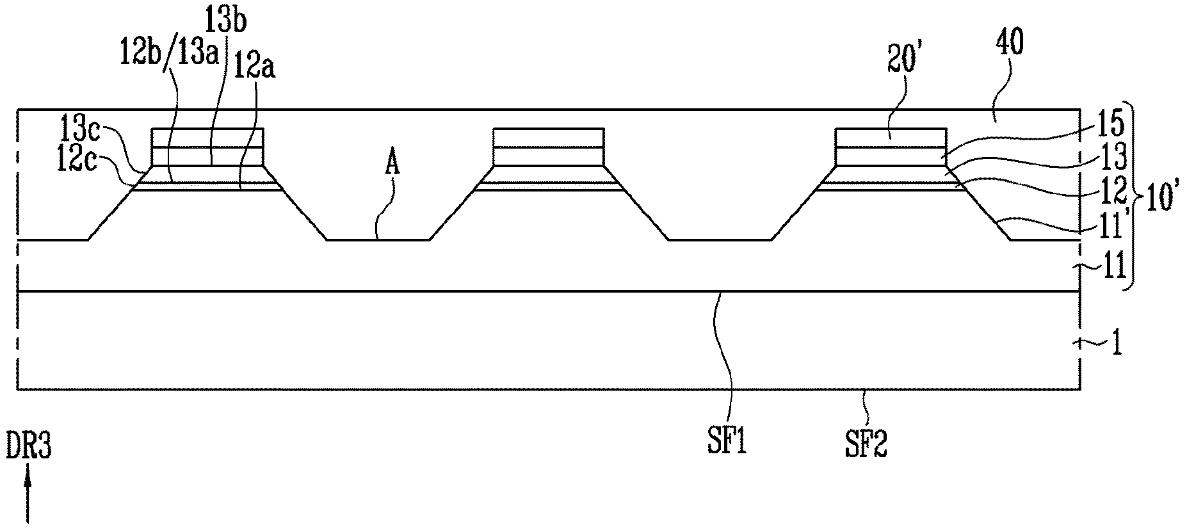
Figure 11:
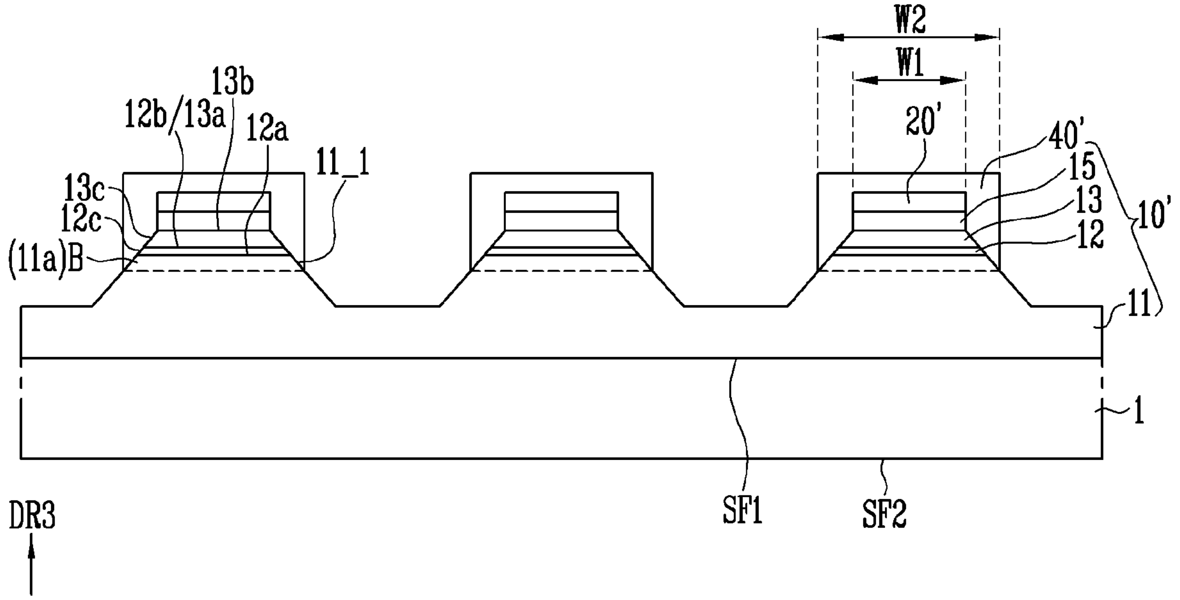
Figure 12:
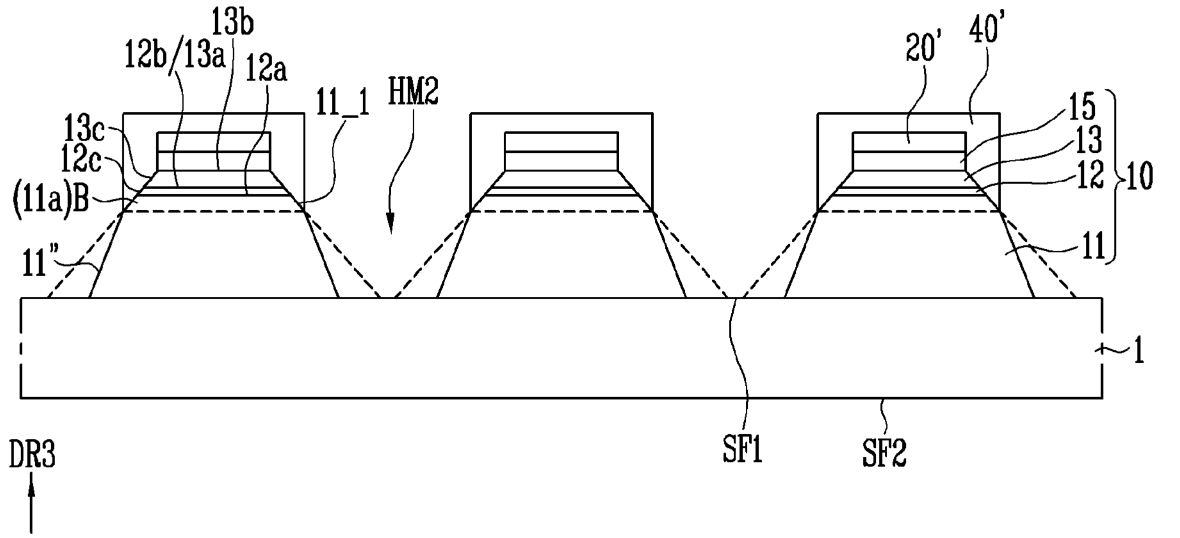

The active layer 12 may include a first surface 12*a* in contact with the first semiconductor layer 11, a second surface 12*b* in contact with the second semiconductor layer 13, and a side 12*c* connected to the first and second surfaces 12*a* and 12*b*. The side 12*c* of the active layer 12 may be inclined in an oblique direction of the third direction DR3 while the first etching process described with reference to FIG. 9 is performed. As the first end portion EP1 of the light emitting element LD faces the pixel electrode AE and the second end portion EP2 of the light emitting element LD faces the common electrode CE in the process of bonding the light emitting element LD and the pixel electrode AE to each other, the active layer 12 may have a reverse tapered shape or a substantially reverse tapered shape. Accordingly, the side 12*c* of the active layer 12 may be inclined in the image display direction (or light emission direction). As some lights moving toward the side 12*c* of the active layer 12 among lights emitted from the active layer 12 advance towards the common electrode CE due to the side 12*c* of the active layer 12, the amount of light finally emitted in the image display direction may increase. In an example, some lights of which reflection and circulation are repeated in the active layer 12 move toward the side 12*c* of the active layer 12, the lights may advance toward the common electrode CE due to the side 12*c* of the active layer 12. Accordingly, the amount of light finally emitted from the pixel PXL increases, and thus the light emission efficiency of the light emitting element LD may be improved.

In an embodiment, a cover layer CVL may be provided and/or formed on the common electrode CE as shown in FIG. 26.

The cover layer CVL may be an encapsulation substrate or have the form of an encapsulation layer provided as a multi-layer. The cover layer CVL may prevent external oxygen and moisture from being introduced into the display element layer DPL and the pixel circuit layer PCL. In an embodiment, the cover layer CVL may be a planarization layer for reducing a step difference generated by components disposed on the bottom thereof.

In an embodiment, an upper substrate U_SUB may be provided on the cover layer CVL as shown in FIG. 27.

The upper substrate U_SUB may be provided on the display element layer DPL to cover the pixel area PXA.

The upper substrate U_SUB may include a base layer BSL, a light conversion pattern LCP, and a light blocking pattern LBP.

The base layer BSL may be a rigid substrate or a flexible substrate, and the material or property of the base layer BSL is not particularly limited. The base layer BSL may include a same material or a similar material as the substrate SUB, or may include a material different from the material of the substrate SUB.

The light conversion pattern LCP may be disposed on one surface or a surface of the base layer BSL to correspond to the emission area EMA of the pixel PXL. The light conversion pattern LCP may include a color conversion layer CCL and a color filter CF, which correspond to a color.

The color conversion layer CCL may include color conversion particles QD corresponding to the color. The color filter CF may allow light of the color to be selectively transmitted therethrough.

The color conversion layer CCL may be disposed on one surface or a surface of an insulating layer INS to face the light emitting element LD, and include color conversion particles QD for converting light emitted from the light emitting element LD to advance toward the common electrode CE into light of a specific color. In an example, in case that the light emitting element LD emits blue series light (hereinafter, referred to as "blue light"), the color conversion layer CCL may include color conversion particles QD including a white quantum dot, which converts blue light into white light. The color conversion particles QD including the white quantum dot may include a red quantum dot and a green quantum dot, thereby converting blue light emitted from the light emitting element LD into white light. However, the configuration of the color conversion layer CCL is not limited to the above-described embodiment.

The color filter CF may be disposed on the one surface or a surface of the base layer BSL to face the color conversion layer CCL, and allow white light converted in the color conversion layer CCL to be selectively transmitted as red light, green light or blue light therethrough. In case that the pixel PXL is a red pixel, the color filter CF may include a red color filter. In case that the pixel PXL is a green pixel, the color filter may include a green color filter. In case that the pixel PXL is a blue pixel, the color filter may include a blue color filter.

The light conversion pattern LCP including the color conversion layer CCL and the color filter CF may be located in the emission area EMA of the pixel PXL. The color conversion layer CCL and the color filter CF may correspond to the pixel electrode AE exposed by the opening OP of the bank BNK.

The insulating layer INS may be provided and/or formed between the color filter CF and the color conversion layer CCL.

The insulating layer INS may be located over the color filter CF, thereby protecting the color filter CF. The insulating layer INS may be an inorganic insulating layer including an inorganic material or an organic insulating layer including an organic material.

The light blocking pattern LBP may be located adjacent to the light conversion pattern LCP. In an embodiment, the light blocking pattern LBP may be disposed on the one surface or a surface of the base layer BSL to correspond to the non-emission area NEMA of the pixel PXL. The light blocking pattern LBP may correspond to the bank BNK of the display element layer DPL.

The light blocking pattern LBP may include a first light blocking pattern LBP1 and a second light blocking pattern LBP2.

The first light blocking pattern LBP1 may be located on the one surface or a surface of the base layer BSL, and be located adjacent to the color filter CF. The first light blocking pattern LBP1 may include at least one black matrix material among various kinds of black matrix materials (for example, at least one light blocking material as appreciated by one of ordinary skill in the art) and/or a color filter material of a specific color. In an embodiment, the first light blocking pattern LBP1 may be provided in the form of a multi-layer in which at least two color filters which allow light of different colors to be selectively transmitted therethrough among the red color filter, a green color filter, and the blue color filter overlap each other.

The insulating layer INS may be provided and/or formed on the first light blocking pattern LBP1. The insulating layer INS may be entirely located on the first light blocking pattern LBP1 and the color filter CF.

The second light blocking pattern LBP2 may be provided and/or formed on one surface or a surface of the insulating layer INS to correspond to the first light blocking pattern LBP1. The second light blocking pattern LBP2 may be a black matrix. The first light blocking pattern LBP1 and the second light blocking pattern LBP2 may include a same material or a similar material. In an embodiment, the second light blocking pattern LBP2 may be a structure finally defining the emission area EMA of the pixel PXL. In an example, the second light blocking pattern LBP2 may be a dam structure finally defining the emission area EMA to which the color conversion layer CCL including the color conversion particles QD is to be supplied in a process of supplying the color conversion layer CCL. The second light blocking pattern LBP2 may surround the color conversion layer CCL.

The above-described upper substrate U_SUB may be located on the cover layer CVL to be coupled or connected to the display element layer DPL. To this end, the cover layer CVL may include a transparent adhesive layer (or gluing layer) for reinforcing adhesion between the display element layer DPL and the upper substrate U_SUB.

Hereinafter, application fields of the display device DD in accordance with an embodiment of the disclosure will be described with reference to FIGS. 29 to 32.

FIGS. 29 to 32 are schematic views illustrating application examples of the display device in accordance with embodiments.

Figure 29:
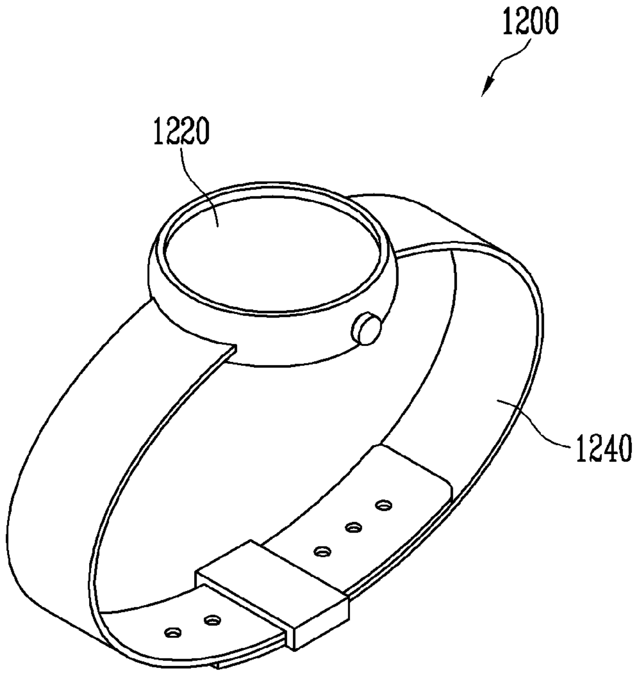
FIGS. 29 to 32 are schematic views illustrating application examples of the display device in accordance with embodiments.

First, referring to FIGS. 21 and 29, the display device DD may be applied to a smart watch 1200 including a display part 1220 and a strap part 1240.

The smart watch 1200 is a wearable electronic device, and may have a structure in which the strap part 1240 is mounted on a wrist of a user. The display device DD is applied to the display part 1220, so that image data including time information may be provided to the user.

Figure 30:
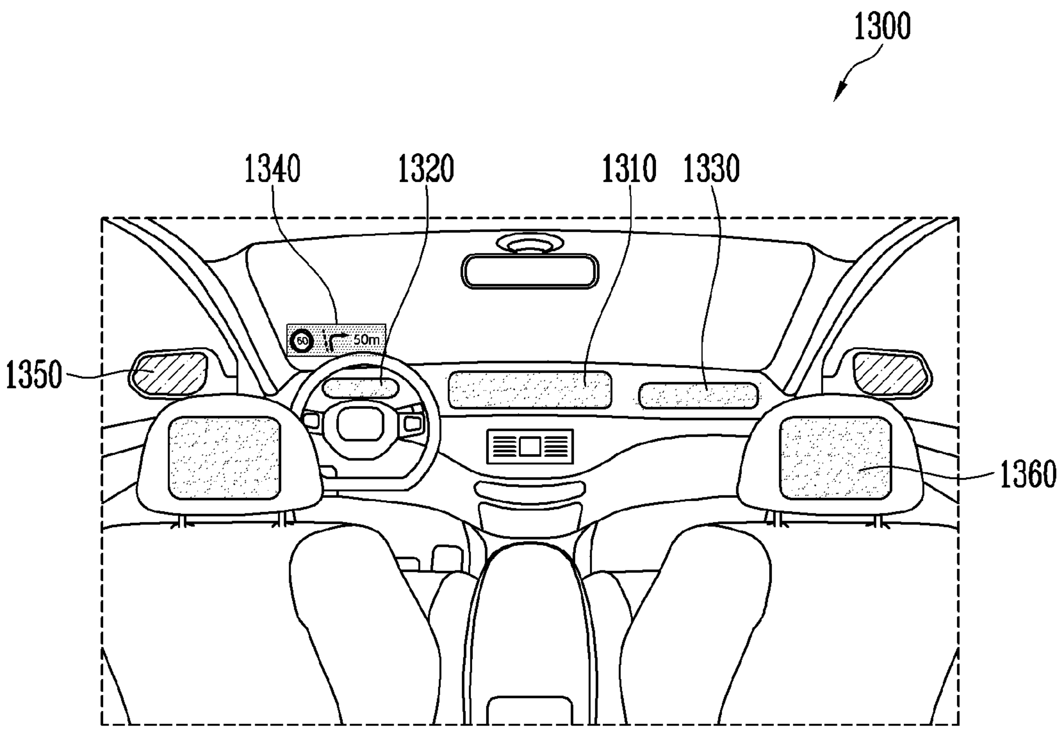

Referring to FIGS. 21 and 30, the display device DD may be applied to an automotive display 1300. The automotive display 1300 may mean an electronic device provided at the inside or the outside of a vehicle to provide image data.

For example, the display device DD may be applied to at least one of an infortainment panel 1310, a cluster 1320, a co-driver display 1330, a head-up display 1340, a side mirror display 1350, and a rear seat display 1360, which are provided in the vehicle.

Figure 31:
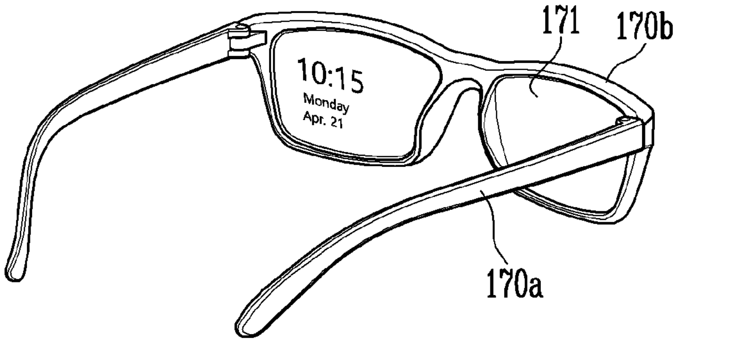

Referring to FIGS. 21 and 31, the display device DD may be applied to smart glasses including a frame 170 and a lens part 171. The smart glasses are a wearable electronic device which may be worn on the face of a user, and may have a structure in which a portion of the frame 170 is folded or unfolded. For example, the smart glasses may be a wearable device for Augmented Reality (AR).

The frame 170 may include a housing 170*b* supporting the lens part 171 and a leg part 170*a* for allowing the user to wear the smart glasses. The leg part 170*a* may be connected to the housing 170*b* by a hinge to be folded or unfolded.

A battery, a touch pad, a microphone, a camera, and the like may be built in the frame 170. A projector for outputting light, a processor for controlling a light signal, for example, and the like may be built in the frame 170.

The lens part 171 may be an optical member which allows light to be transmitted therethrough or allows light to be reflected thereby. The lens part 171 may include glass, a transparent synthetic resin, for example, within the spirit and the scope of the disclosure.

Also, the lens part 171 may allow an image caused by a light signal transmitted from the projector of the frame 170 to be reflected by a rear surface (for example, a surface in a direction facing eyes of the user) of the lens part 171, thereby enabling the eyes of the user to recognize the image. For example, as shown in the drawing, the user may recognize information including time, data, and the like, which are displayed on the lens part 171. For example, the lens part 171 is a type of display device, and the display device DD may be applied to the lens part 171.

Figure 32:
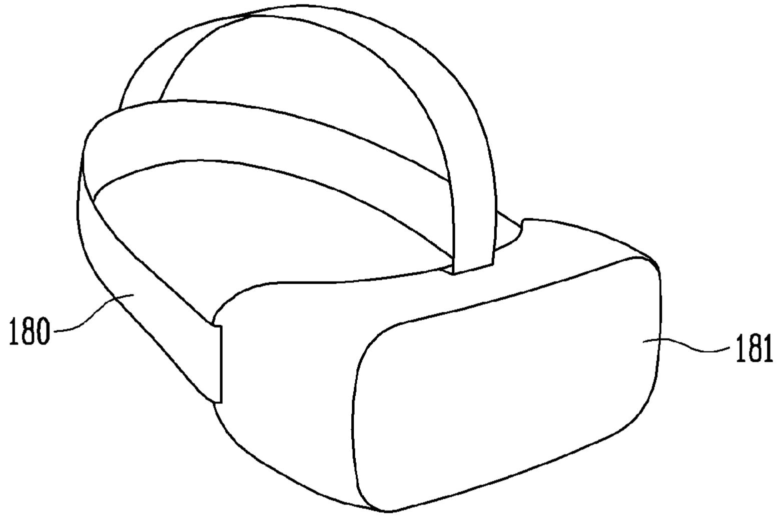

Referring to FIGS. 21 and 32, the display device DD may be applied to a Head Mounted Display (HMD) including a head mounted band 180 and a display accommodating case 181. The HMD is a wearable electronic device which may be worn on the head of a user.

The head mounted band 180 is a part connected to the display accommodating case 181, to fix the display accommodating case 181. In the drawing, it is illustrated that the head mounted band 180 may surround a top surface and both side surfaces of the head of the user. However, the disclosure is not limited thereto. The head mounted band 180 is used to fix the HMD to the head of the user, and may be formed in the shape of a glasses frame or a helmet.

The display accommodating case 181 accommodates the display device DD, and may include at least one lens. The at least one lens is a part which provides an image to the user. For example, the display device DD may be applied to a left-eye lens and a right-eye lens, which are implemented in the display accommodating case 181.

In accordance with the disclosure, the active layer is designed to have a reverse tapered shape, thereby minimizing light leaked inside the light emitting element. Accordingly, the light emission efficiency of the light emitting element may be improved.

In accordance with the disclosure, a defect of the light emitting element is reduced, thereby increasing the lifespan of the light emitting element.

Example embodiments have been disclosed herein, and although specific terms may be employed, they are used and are to be interpreted in a generic and descriptive sense only and not for purpose of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure and as set forth in the following claims.

What is claimed is:

1. A light emitting element comprising:

a first end portion and a second end portion facing each other in a length direction, the light emitting element comprising:

a first semiconductor layer disposed at the second end portion;

an active layer disposed on the first semiconductor layer;

a second semiconductor layer disposed on the active layer;

a first electrode disposed on the second semiconductor layer; and a second electrode disposed on the first electrode, wherein the active layer includes:

a first surface contacting the first semiconductor layer;

a second surface facing the first surface and contacting the second semiconductor layer; and a side connected to the first surface and the second surface, the first semiconductor layer includes a first area, a second area, and a third area partitioned sequentially in a direction toward the second end portion from the first surface of the active layer, and a side of the first area is inclined in a same direction as the side of the active layer, a side of the second area is inclined in a direction opposite to the direction in which the side of the active layer is inclined, and a side of the third area includes a straight line part parallel to the length direction of the light emitting element.

2. The light emitting element of claim 1, wherein the first semiconductor layer includes an n-type semiconductor layer doped with an n-type dopant, and the second semiconductor layer includes a p-type semiconductor layer doped with a p-type dopant.

3. The light emitting element of claim 2, wherein a slope of the side of the first area is equal to a slope of the side of the active layer, and a slope of the side of the second area is different from the slope of the side of the active layer.

4. The light emitting element of claim 1, further comprising:

an insulating film surrounding an outer circumferential surface of each of the first semiconductor layer, the active layer, the second semiconductor layer, and the first electrode.

5. A method of manufacturing a light emitting element, the method comprising:

forming a light emitting stack structure including a first semiconductor layer, an active layer, a second semiconductor layer, and a first electrode on a substrate;

exposing an area of the first semiconductor layer by forming a first mask pattern on the first electrode and etching the light emitting stack structure in a vertical direction through a first etching process using the first mask pattern;

forming a second mask pattern on the light emitting stack structure;

exposing the substrate by etching an area of the first semiconductor layer through a second etching process using the second mask pattern;

forming a light emitting stack pattern by etching a side of the first semiconductor layer not covered by the second mask pattern, through a third etching process;

exposing the first electrode by removing the first mask pattern and the second mask pattern; and forming an insulating film surrounding a surface of the light emitting stack pattern by forming an insulating material layer on the light emitting stack pattern and etching the insulating material layer in the vertical direction, wherein the first semiconductor layer is partitioned into a first area, a second area, and a third area sequentially in the direction away from the active layer toward the substrate, with the first area in direct contact with the second area and the second area in direct contact with the third area, in the forming of the light emitting stack pattern, and a side of the first area is inclined in a same direction as a side of the active layer, a side of the second area is inclined in a direction opposite to the direction in which the side of the active layer is inclined, and a side of the third area includes a straight line part parallel to the vertical direction.

6. The method of claim 5, wherein each of the first etching process and the second etching process is a dry etching process, and the third etching process is a wet etching process.

7. The method of claim 5, wherein the first semiconductor layer includes an n-type semiconductor layer doped with an n-type dopant, and the second semiconductor layer includes a p-type semiconductor layer doped with a p-type dopant.

8. The method of claim 5, wherein a slope of the side of the first area is equal to a slope of the side of the active layer, and a slope of the side of the second area is different from the slope of the side of the active layer.

9. The method of claim 5, wherein the second mask pattern covers the side of the first area of the first semiconductor layer and completely covers the first mask pattern, the first electrode, the second semiconductor layer, and the active layer in the forming of the second mask pattern.

10. The method of claim 9, wherein the first mask pattern and the second mask pattern include silicon oxide.

11. The method of claim 5, further comprising:

after the forming of the insulating film, forming a second electrode on the first electrode; and forming a third electrode on the second electrode.

12. The method of claim 11, wherein the first electrode includes a transparent conductive material, and the second electrode includes a conductive material having reflexibility.

13. A display device comprising:

pixels disposed on a substrate, wherein each of the pixels includes:

at least one transistor disposed on the substrate;

a pixel electrode electrically connected to the at least one transistor;

a bank disposed on the pixel electrode, the bank including an opening exposing the pixel electrode;

a light emitting element disposed in the opening of the bank to be bonded to the pixel electrode, the light emitting element including a first end portion and a second end portion facing each other in a length direction; and a common electrode disposed on the light emitting element, wherein the light emitting element includes:

a third electrode;

a second electrode;

a first electrode;

a second semiconductor layer;

an active layer; and a first semiconductor layer disposed in a direction toward the common electrode from the pixel electrode, the first semiconductor layer includes a first area, a second area, and a third area partitioned sequentially in the direction toward the common electrode from the pixel electrode, and a side of the first area is inclined in a same direction as the side of the active layer, a side of the second area is inclined in a direction opposite to the direction in which the side of the active layer is inclined, and a side of the third area includes a straight line part parallel to the length direction.

14. The display device of claim 13, wherein the active layer has a substantially reverse tapered shape between the pixel electrode and the common electrode.

15. The display device of claim 14, wherein the light emitting element includes:

the third electrode disposed at the first end portion, the third electrode electrically connected to the pixel electrode and electrically contacting the pixel electrode;

the first semiconductor layer disposed at the second end portion, the first semiconductor layer electrically connected to the common electrode and electrically contacting the common electrode;

the second electrode disposed on the third electrode between the third electrode and the first semiconductor layer;

the first electrode disposed on the second electrode between the second electrode and the first semiconductor layer;

the second semiconductor layer disposed on the first electrode between the first electrode and the first semiconductor layer; and the active layer disposed between the second semiconductor layer and the first semiconductor layer.

16. The display device of claim 15, wherein the first semiconductor layer is an n-type semiconductor layer doped with an n-type dopant, and the second semiconductor layer is a p-type semiconductor layer doped with a p-type dopant.

17. The display device of claim 15, wherein the first electrode includes a transparent conductive material, and the second electrode includes a conductive material having reflexibility, and the third electrode is a bonding electrode that bonds the pixel electrode and the light emitting element.

18. The display device of claim 15, wherein the pixel electrode includes a conductive material having reflexibility, and the common electrode includes a transparent conductive material.

19. The display device of claim 15, wherein each of the pixels further includes an intermediate layer disposed between the bank and the common electrode to fill the opening of the bank, and the intermediate layer fixes the light emitting element, and includes a material which has an adhesive property and is cured.

20. The display device of claim 15, wherein each of the pixels further includes:

an emission area including the light emitting element and a non-emission area adjacent to the emission area;

a cover layer disposed entirely on the common electrode; and an upper substrate disposed on the cover layer.

* * * * *